(12) United States Patent
Bucher

(10) Patent No.: US 8,228,056 B2
(45) Date of Patent: Jul. 24, 2012

(54) AUTOMATIC DETERMINATION OF THE POSITION OF AN OBJECT

(75) Inventor: Tilman Bucher, Munich (DE)

(73) Assignee: Cairos Technologies AG, Karlsbad (DE)

( * ) Notice: Subject to any disclaimer, the term of this patent is extended or adjusted under 35 U.S.C. 154(b) by 865 days.

(21) Appl. No.: 12/234,334

(22) Filed: Sep. 19, 2008

(65) Prior Publication Data
US 2009/0072817 A1    Mar. 19, 2009

(30) Foreign Application Priority Data

Sep. 19, 2007  (DE) .......................... 10 2007 044 969
Oct. 10, 2007  (DE) .......................... 10 2007 048 818

(51) Int. Cl.
G01B 7/14    (2006.01)
A63B 63/00   (2006.01)

(52) U.S. Cl. ........... 324/207.16; 324/207.18; 324/207.2; 324/207.21; 702/150; 473/478

(58) Field of Classification Search .......... 324/326–329, 324/207.15–207.17, 207.2–207.25
See application file for complete search history.

(56) References Cited

U.S. PATENT DOCUMENTS

| | | | |
|---|---|---|---|
| 5,920,194 A * | 7/1999 | Lewis et al. .................... | 324/326 |
| 6,297,736 B1 * | 10/2001 | Lewis et al. .................... | 340/551 |
| 7,057,383 B2 * | 6/2006 | Schlapp et al. ................. | 324/67 |
| 2005/0270156 A1 * | 12/2005 | Ravet .......................... | 340/572.1 |

* cited by examiner

*Primary Examiner* — Jay Patidar
(74) *Attorney, Agent, or Firm* — Weiss & Moy, P.C.; Jeffrey D. Moy

(57) ABSTRACT

The invention relates to a method for analysis of magnetic fields or signals used for the determination of the position of an object, wherein two temporally to each other shifted magnetic signals or fields are generated by two conductors arranged at least in part or completely separated from each other. The magnetic fields generated by the conductors are consecutively being captured by at least one and preferably three sensors arranged orthogonally to each other and determining from the captured signals information for determining the position of the object carrying the sensors relative to the conductors.

14 Claims, 14 Drawing Sheets

AUTOMATIC DETERMINATION OF THE POSITION OF AN OBJECT

CROSS-REFERENCE TO RELATED APPLICATIONS

This application claims priority to German Patent Application No. 10 2007 044 969.2 filed 19 Sep. 2007 and German Patent Application No. 10 2007 048 818.3 filed 10 Oct. 2007.

BACKGROUND OF THE INVENTION

1. Field of the Invention

The present invention relates to apparatuses and methods allowing implementation of a fully automated or semi-automated determination of the position of an object, in particular of a piece of sports equipment, for example a ball or soccer ball.

2. Description of the Related Art

A system and a method for tracking the movement of an object within a predetermined area is known from US 2002/0270156 A1 by Gary Ravet.

SUMMARY OF THE INVENTION

According to an aspect of the invention, a method for analyzing magnetic fields or signals used for determining the position of an object, the method comprises: (i) generating, by two conductors, two temporal shifted magnetic signals or fields, the two conductors being at least partially or completely separate arranged from each other; (ii) capturing, by at least one and preferably three preferable orthogonal arranged sensors, the magnetic fields generated consecutively by the conductors; and (iii) determining information for the determination of the position of the object bearing said sensors relatively to the conductors from the captured signals.

An arrangement of at least two electrical conductors is another aspect of the invention, wherein the conductors are placed parallel to each other, in particular, standing horizontally to each other, wherein both conductors are adapted to generate a magnetic field, each of the at least two conductors being connected to a current source, and wherein at least one end of each of said at least two conductors, which is averted to the connection with the current source is electronically connected to grounding means.

According to yet another aspect of the invention, a goal of a sports field has two posts and a crossbar, wherein the posts and the crossbar are composed essentially of electrical conductive material, wherein the posts extend essentially at least to the surface of the sports field, and wherein a conductor loop which encompasses at least a part of the goal of a sports field, said conductor loop being punctuated by at least one electrical non-conductive element.

It is a further aspect of the present invention to provide an improved method for the analysis of field strengths of periodical varying fields for the determination of the position of a suitable object.

Furthermore, it is an aspect of the invention to enable an accurate measurement of the position of the ball by means of magnetic fields in the area of the goal.

It is another aspect of the invention to provide a method and apparatus with which an exactly parallel laying of individual conductors at the same level underneath the surface of a sports field is possible.

It is yet another aspect of the invention to provide an apparatus with which it can be determined if a goal was undoubtedly scored.

BRIEF DESCRIPTION OF THE DRAWINGS

The accompanying drawings are incorporated into and form a part of the specification for the purpose of explaining the principles of the invention. The drawings are not to be construed as limiting the invention to only the illustrated and described examples of how the invention can be made and used. Further features and advantages will become apparent from the following and more particular description of the invention, as illustrated in the accompanying drawings, wherein.

DETAILED DESCRIPTION OF THE INVENTION

Figure 1:
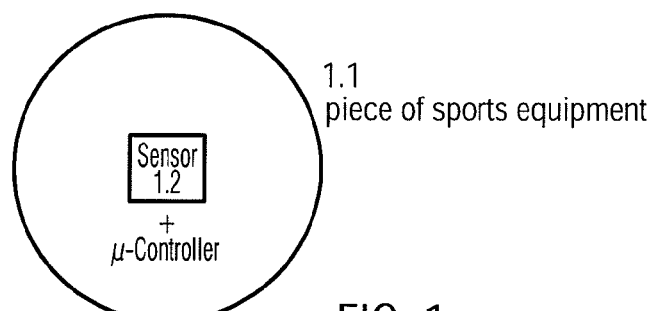
FIG. 1 shows a schematic depiction of a piece of sports equipment with integrated receiving unit/measuring sensor according to an embodiment.
Figure 2:
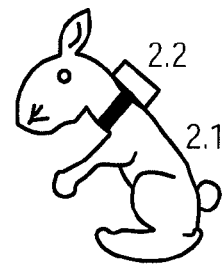
FIG. 2 shows a schematic depiction of an experimental animal having a receiving unit/measuring sensor attached to it according to an embodiment.

The illustrative embodiments of the present invention will be described with reference to the figure drawings wherein like elements and structures are indicated by like reference numbers. The invention is illustrated by means of the attached Figures, wherein the invention may comprise the shown features individually or in any meaningful combination.

The apparatuses and methods described in the following may all be used both individually and in combination with each other. In particular, the second aspect of the invention as described below describing the preferable one sided grounding of one signal line, for example of a goal out of bounds line which has been laid out for determining the position and the described formation of a goal for avoiding the appearance of a conductor loop or a closed circuit according to a third aspect of the invention alleviates the determination of the position according to the method described hereafter. Naturally the described conductors could also be grounded without further intended usage of the described positioning determination method and may be used with or without a goal having one or more isolations.

The underlying technical method for measuring and determination of low frequency periodical varying field strength of short signal lengths forms the basis of determining the position of an suitable object, for example of a ball comprising magnetic field sensors and a electronics. The described method is mainly suitable for applications in which the measurement sensor system must be realized in preferably small closed units. Examples of use include in the field of biology/zoology the tracking of motion sequences of animals without the measuring sensor affecting the behavior of the animal. Or, the exact localization of pieces of sports equipment, for example for determining, if the piece of sports equipment has crossed a certain line at a certain point in time.

Usually, amplitudes of periodical signals are measured by means of electronics. Thereby, the signal is rectified electronically. Afterwards the examination of the signal strength and the amplitudes respectively of a signal can take place by measuring the level of the rectified signal. For short signal durations (for example <5 periods) for a single signal as it becomes especially for time multiplex method necessary, this method is deficient. When using a time multiplex method, each measurement is separated so that at a certain point in time only one signal or one field respectively for each measurement exists. In order to accomplish a spatial resolution several fields having different geometry have to be generated. In time multiplex methods, these fields are generated chronologically separate. In order to achieve the spatial resolution over a specific period in time, all fields must be actuated within this interval once. For an object or play tools which are able to move at a speed of up to 30 meters per second, and for a requested spatial resolution of 0.06 meters, the resulting time interval is 2 milliseconds, in which all fields must be actuated individually consecutively. At a typical frequency of 5 kHz, that means 5 periods per ms this would mean having only 10 periods altogether within the possible time frame. Consequently, when assuming two fields in a time multiplex method, a maximum of five periods remain for analysis.

"Quasi-static fields" are used for the consideration. Because of possible sources of interference of static fields, like for example the magnetic field of the earth when considering the magnetic field strength, low frequency alternating fields in the order of magnitude from 1 kHz to 10 kHz are used. Under electromagnetic consideration, these fields can be considered to be static, that means that the Maxwell's equations remain in first order static, there will be no relevant electromagnetic radio signals.

While electro technical processing of the signal of the ball, all electro technical means for processing periodical signals are available, such as for example high pass filters and low pass filters. Thereby distinct fields can be generated and may be converted comparatively noise free into periodically signals when received by using suitable electro technical filters, such as high pass filters or low pass filters.

In order to achieve spatial resolution, multiple fields having different geometries must be generated. By comparing the different field strengths, conclusions with respect to the whereabouts of the receiver can be drawn based on the physical laws of field generation. When generating magnetic fields by means of an electrical current, the resulting field is defined by Biot Savart's law. For static fields, the definition results analog on the basis of Maxwell's equations for the static case. By means of these laws, a determination of the position can be carried out using mathematical operations for example trigonometry.

Decisive for the accuracy of the system is that the changing of the field (gradient of the field) for the required spatial resolution along one co-ordinate is not below the resolution of the field strength of the technical operation. This means, when presuming a spatial resolution of 0.06 meters and a measurement accuracy of the sensor of 1%, each involved field must exhibit at least a variation of the field of 1% over the distance of said 0.06 meters.

For measuring periodical fields, usually a three-dimensional magnetic field sensor mounted inside the piece of sport equipment or ball is used, technically functioning for example as a Hall sensor or by means of magneto resistive elements. It is a disadvantage of this technique that the sensors simultaneously also measure the constant static magnetic fields like the magnetic field of the earth. In a normal case, however, the magnetic field of the earth is by several orders of magnitude stronger than the generated measurement fields. The measurement field is then measurable only as a superposition of the much stronger static field. The sensitivity of the sensor with respect to the relevant measurement field is therefore limited.

A sensor comprising three orthogonally placed coils measuring varying fields merely by means of induction is considerably more effective for measuring such periodical varying magnetic fields. Electro technically caused interference, for example the noise of the individual components of the sensors, are not carrying weight too much as the generated output voltage is significantly larger than the super positioned signal from the magnetic field sensors when selecting suitable coils. Using a coil results in a further positive effect compared to a Hall sensor or a magneto-resistive sensor respectively because of its larger size. Negative effects of the printed circuit board of the sensor, such as induced circular currents close to the sensor effect the small magnetic field sensors relatively stronger. These effects do not carry weight too much due to the larger effective cross section of the measurement coils.

Figure 4:
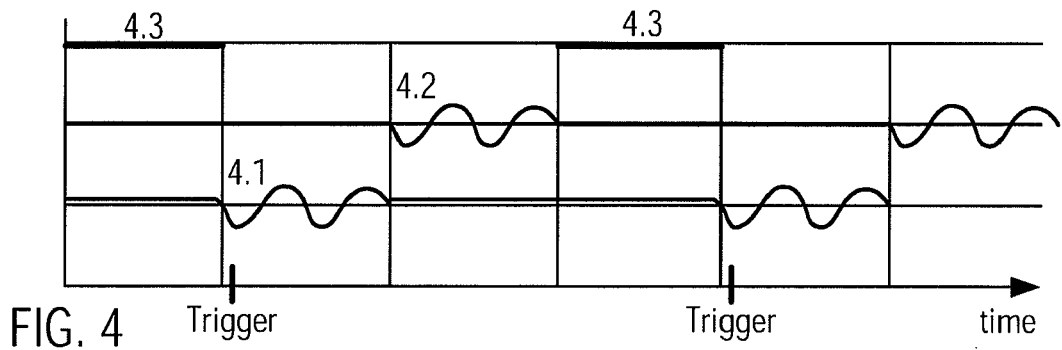
FIG. 4 shows a depiction of the time multiplex method using two fields according to an embodiment, where 4.1 relates to signal field 1, 4.2 relates to signal field 2, and 4.3 relates to s signal free time.

When using a time multiplex method, different periodical fields of, for example two conductors which are laid, for instance, in parallel to each other at about the same distance to a line are getting activated timely one after another in a defined way. In order to start a determination of the position, first a trigger signal is generated. This trigger signal can be generated at all fields at the same time or at only one or at several determined fields. This trigger signal consists for example of a shoulder of a signal after a defined signal free time of one or more cycle duration or longer. Afterwards, the individual fields are switched on and off in a defined manner one after another (FIG. 4). The determined values of the individual fields are managed by an integrated micro controller 3.5 and will be sent by means of radio communication 3.6, 3.7 to one howsoever-natured control unit 3.8 for further processing.

Thereby, the following applies for the detection of the trigger signal:

In periodical distances, the field strength is measured using a three-dimensional sensor 3.2. In case the individual measurements do not differ from each other or the difference of the individual values ($W_i$) remain below a threshold if the reception unit is positioned within the measurement area, the system resides in a state without activated alternating field 4.3.

$$|W_n - W_{n+1}| < \text{ThresholdValue}$$

In case a predetermined number (for example >3) of consecutive measurements are not exceeding this threshold value, the system is activated for triggering. For the trigger point that measurement value ($W_j$) is used for which hold $$W_j > \text{TriggerThresholdValue} \quad \text{(FIG. 4)}$$

Figure 3:
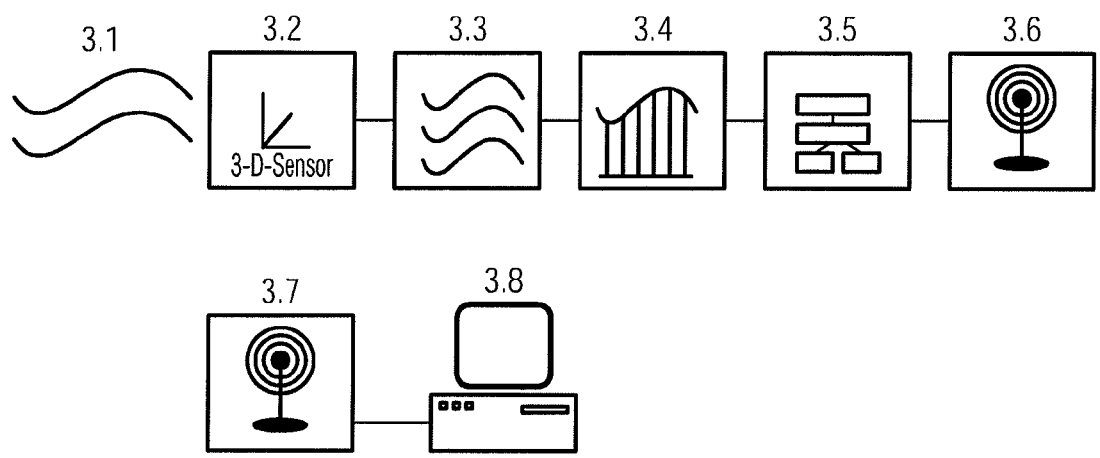
FIG. 3 shows a schematic depiction of the technical method according to an embodiment.

Starting with this trigger point, the processing according to FIG. 3 starts. After running through one measurement cycle for determining the position of the current place, the process of detecting a trigger point starts over.

For the analysis of an individual defined field, the following holds:

A periodical field 3.1 of a predetermined frequency is detected by a three-dimensional sensor 3.2 and converted into electrical alternating voltage. Using a frequency pass, the defined frequency is filtered out of the signal in the analogue domain. Herefrom results the three periodical signals of defined frequency for the three orthogonal directions in space of the measuring sensor 3.3. These signals are now processed in the digital domain. The proceeding is the same for all three directions in space. Using an analog-to-digital converter 3.4, the electrical voltage of the signal is measured at defined intervals $T_J$ of same length. (N+1) measurements are conducted per direction in space, wherein N shall be odd numbered.

The following holds:

$$T_j * N = \text{cycle duration.}$$

That means that the $(N+1)^{th}$ measurement value has the same phase as the first measurement value and therefore the entire period has run through.

Thereby the discrete measurement points are uniformly distributed over one period. The clock frequency of the discrete measurement $F_{clock}$ behaves compared to the signal frequency $F_{clock}$ signal as follows:

$$F_{clock} = N * F_{signal}$$

the thereby obtained (N+1) measurement values are evaluated in an integrated micro controller 3.5 using a defined algorithm and consequently result in the sought signal amplitude for each direction in space. The results may get communicated or transmitted to an external recipient 3.7 for further processing by a transmitter integrated into the piece of sports equipment as well.

In principal, this method also works without using the multiplex method, only for determining the amplitude of one arbitrary alternating field.

Preferably the methods A1, A2, A3 described in the following can be used individually or combined with each other.

It is the background of the method that by differentiating a periodic function and following integration possible, for example generated by an offset, constants dissolve. Applied to this technical method, this means that a possible offset dissolve. In a technical application this means when using discrete measurement points as disclosed by this method, that the individual absolute distances between the individual discrete values (W) need to be added and then divided by N in order to get a value for the amplitude:

$$A1 = \frac{\sum_{i=1}^{N} \text{ABS}(W_i - W_{i+1})}{N}$$

Figure 5:
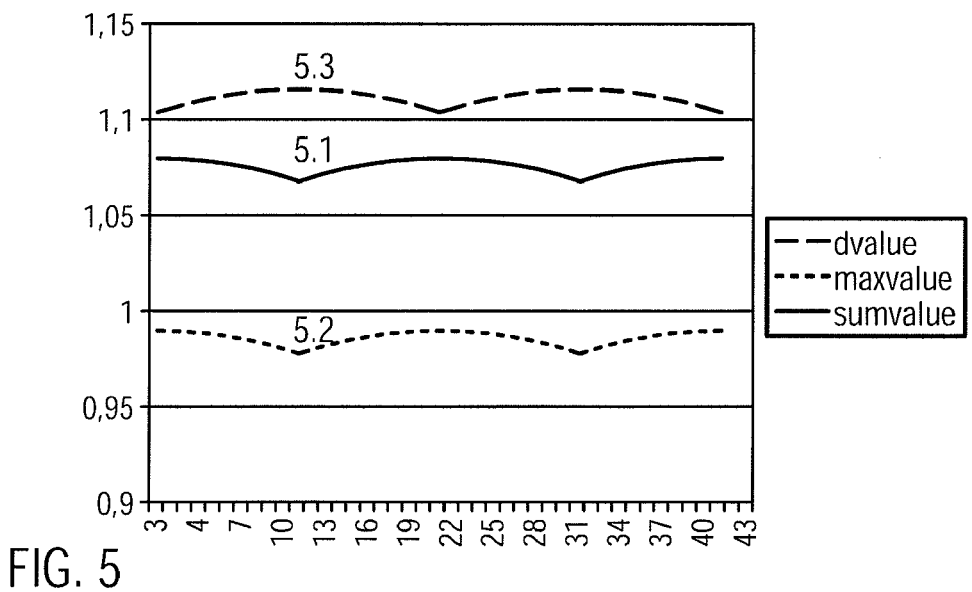
FIG. 5 shows a solution for each method for a phase 0 to TI at N=11, where in 5.1: A1, in 5.2: A2, and in 5.3: A3 is shown.

In FIG. 5, 5.1 shows the solution for a phase zero to $T_j$ for N=11. For reasons of visualization, this value was multiplied by 3. One can find immediately, that this method results in a systematic error or circa inner systematic error of approximately one percent, which depends on the phasing relating to the interval T3.

One can use further methods for measuring the amplitude such as the method of calculating the difference between the largest and the smallest value.

$$A2 = \text{MAX}(\{W_i\}) - \text{MIN}(\{W_i\}), \text{ where } i \leq 1 \leq N$$

In this case one gets a solution according to curve 5.2 for the same phase as shown in 5.1 and N=11. For visualization reasons, this value was divided by 2. Here too one can find a systematic error of approximately one percent.

A further method results from the comparison of the largest and smallest difference between two adjacent measurement values and the sum of the absolute values of both. The solution of the equation $$A3 = \text{ABS}(\text{MAX}\{W_i - W_{i+1}\}) + \text{ABS}(\text{MIN}\{W_i - W_{i+1}\}),$$
$$\text{where } i \leq 1 \leq N$$

is shown in curve 5.3. Here too one can find for the same parameters a systematic error in the same order of magnitude as for the preceding equations. As one can find easily from FIG. 5, the individual equations behave anti-cyclical in part. Using a suitable combination of the individual solutions A1, A2 and A3 a significant improvement of the measurement accuracy can be achieved once more.

$$\text{AMP} = (\text{Factor1} * A1) + (\text{Factor2} * A2) + (\text{Factor3} * A3)$$

Since A1 and A2 act in phase and exhibit the same percentaged error, actually two in principle redundant simplified solutions result which causes optimization of the result:

$$\text{AMP1} = (\text{Factor1} * A1) + (\text{Factor3} * A3) \text{ and}$$

$$\text{AMP2} = (\text{Factor2} * A2) + (\text{Factor3} * A3) \text{ respectively}$$

The advantage of having two redundant solutions lies in the possibility of reducing possible inaccuracies in the measurement of the individual values by averaging over both solutions.

This analysis or equation respectively can be particularly useful in case of noisy measurement values.

In summary one can say that this technical method is scalable for the micro processor depending on the requirement with respect to accuracy and computational effort. Depending on the requirement, it may be sufficient to regard A1, A2 or A3 as solutions alone. In case of higher requirements with respect to the accuracy certainly AMP1, AMP2 or AMP are reasonable.

Figure 6:
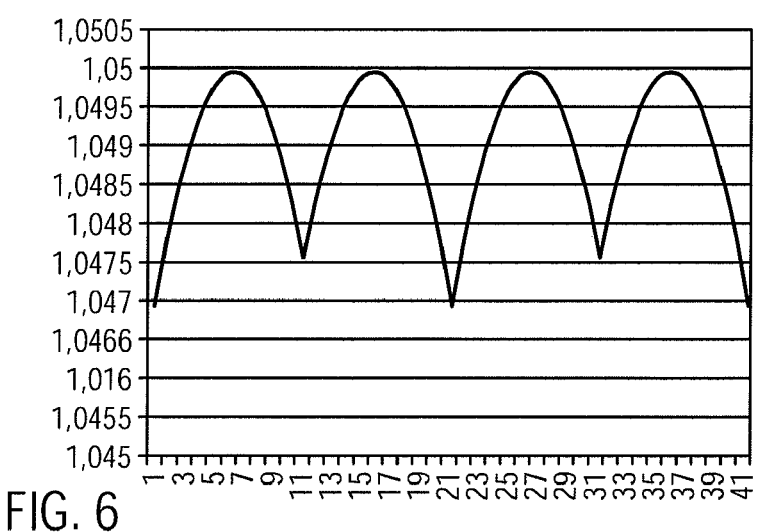
FIG. 6 shows a solution of the used algorithms for a phase 0 to $T_J$ at N=11 using Factor1=0, Factor2=½ and Factor3=1.

Exemplary, FIG. 6 shows a solution for N=11, Factor1=0, Factor2=½ and Factor3=1 with a systematic error of 0.3 percent.

Table 1 lists the systematic errors of the simple solutions A1, A2 or A3 for different N.

TABLE 1

| N | Systematic error |
|---|---|
| 7 | 2.57% |
| 9 | 1.54% |
| 11 | 1.03% |
| 13 | 0.73% |
| 15 | 0.55% |

Table 2 lists the factors for AMP1 or AMP2 respectively for normalizing the solutions with A1, A2 and A3. Because of the redundancy of AMP1 and AMP2 an identical systematic error results for both solutions using the same N. For reasons of simplification, we set Factor3 to 1.0.

TABLE 2

| N | Factor 1 | Factor 2 | Factor 3 | Systematic error |
|---|---|---|---|---|
| 7 | 2.9610 | 0.8460 | 1.0 | 0.65% |
| 9 | 3.0314 | 0.6736 | 1.0 | 0.39% |
| 11 | 3.0675 | 0.5577 | 1.0 | 0.26% |
| 13 | 3.0884 | 0.4751 | 1.0 | 0.18% |
| 15 | 3.1015 | 0.4135 | 1.0 | 0.14% |

The essential advantages of this method are as follows:

The power consumption is low as the micro controller needs to perform only very simple calculation operations. Hence the measuring sensor or receiving unit respectively can be implemented in a form factor as small as possible.

The information is processed promptly, quasi in-time within one measurement period. Thereby no time delay arises. The system is able to process extremely short pulses which must be only slightly longer than one period. The signal's amplitude is measured free of any possible offset. Compared with measuring the amplitude using analog rectification of the signal and subsequent measurement of the level of the voltage, the method used by the present invention is significantly more precise.

A further aspect of the invention concerns the compensation for parasitic coupling of the generated magnetic fields. For example, the metallic cross bar of a goal causes differing strong distortions in the area of a goal line, caused by the magnetic fields generated by the conductors located there, as described below. In order to compensate for this, the respective other conductors whose magnetic field is not currently measured could generate a congeneric preferably in-phase though with respect to the absolute value attenuated magnetic field. Thereby the induced eddy currents at the cross bar can be compensated and at the same time the generated "counter magnetic field" can be deducted. The required magnetic field strength can be determined in the forefront empirical.

Preferably, the conductors of the present invention are controlled by current. Further, the characteristic of the current is controllable using a matrix. The term "matrix" as used herein is defined as follows: the matrix is to be understood as a table, which is stored in a memory and which comprises arbitrary current characteristics for an arbitrary number of channels (corresponding to different conductors). When accessing the matrix, for example, during system operation, the current characteristics stored in the memory are processed so that the respective conductor or the respective conductors are supplied with current according to the given pattern. By doing so, each channel that means each conductor can be programmed separately. Thereby, arbitrary temporal characteristics of the current are imaginable. Furthermore, it is imaginable to use a multiplex with sinusoidal characteristics on the channels one to four using a frequency of 3 kHz and each channel delivers a signal over two periods and in the following third period delivers no signal (pause). In doing so, furthermore a trigger signal can be programmed. Also, a settling phase may be programmed. According to the present invention, advantageously multiple channels or respectively multiple conductors can be supplied with current at the same time.

Figure 7:
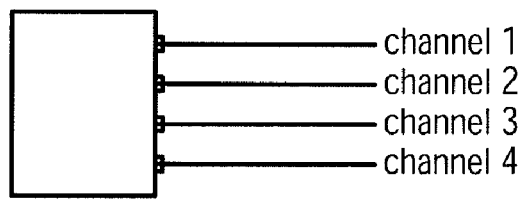
FIG. 7 schematically shows a control unit having four channels according to an embodiment.

FIG. 7 schematically shows a control unit having four channels according to the present invention.

Figure 8:
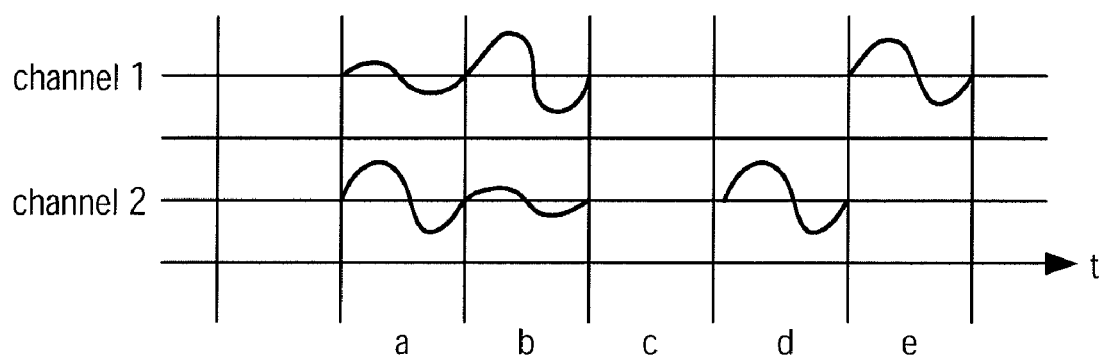
FIG. 8 shows the output of a matrix according to an embodiment.

FIG. 8 shows the output of a matrix, wherein two channels are supplied with current at the same time. One can see, that in time interval a channel 1 is in-phase to channel 2, however having only 40% of the effective value. In doing that, effective values in the range between 10% to 40% are conceivable. In case of interval B this gets inverted. Interval c generates a pause, wherein the channels 1 and 2 are not supplied with any current. Within interval d only channel 2 is supplied with current, in interval e only channel 1. Therefore, in case the ball comes close to the cross bar, the current characteristics of intervals A and B are used to make the distortion at the crossbar symmetrical.

A second aspect of the invention relates to the determination of the position of a mobile piece of sports equipment, wherein the piece of sports equipment could be a ball, in particular a soccer ball. Thereby, the mobile piece of sports equipment carries a sensor, which is able to detect magnetic fields and to measure its field strengths. For example, if there is an electrical conductor arranged in front of a marking line and an electrical conductor arranged behind the marking line of a sports field in such a manner that each of the conductors is parallel to the marking line at the same distance and an electrical current flows through each of the conductors, then each conductor generates a magnetic field, which can be detected by the sensor of the mobile piece of sports equipment. Thus, it is possible, to determine the position of the mobile piece of sports equipment relative to the marking line by means of determining the field strengths of the individual fields generated by the conductors.

In order to cause the flow of electrical current through such a conductor, it is necessary to connect this conductor with a current source. Hence, it is furthermore necessary to provide an electrical return conductor, which closes the circuit generating the magnetic field. It is a problem that this return conductor also generates a magnetic field, which interferes with the magnetic field used for determining the position of the mobile piece of sports equipment. Hence, a significant deviation between the real position of the mobile piece of sports equipment and the position calculated by determining the individual magnetic fields is possible.

An electrical conductor for generating a magnetic field at a sports field, wherein the respective conductor is connected to a current source, is characterized by electrically connecting one end of the conductor with grounding means, wherein the end of the conductor is averted from the connection with the current source.

Consequently, the electrical circuit built partially by the respective conductor can be closed between the two poles of the current source which is connected with one pole to the conductor without having the need of a separate return. The soil takes care of the return, which is connected by the grounding means to the conductor.

The current source is connected with the soil using a grounding means, too, hence the current source is connected to the grounded end of the conductor.

Advantageously, this does not generate an interfering magnetic field, eventually improving the determination of the position of the mobile piece of sports equipment.

In a preferred embodiment, the conductor excluding the connection to the grounding means is electrically isolated from its environment. Consequently, a flow of electrical current from the current source is only possible using the conductor and the grounding means and eventually using the soil.

This is particularly helpful if as in one preferred embodiment, the conductor is placed inside the soil, for example under the surface of a sports field. Thereby an arrangement above the surface of the sports field is not favored as otherwise the conductors would impede the players on the sports field.

It is imaginable, that the conductor is a off-the-shelf flexible cable or wire.

Furthermore, the grounding means could exhibit one or more molds extending from a central part of the grounding means or ground anchor in order to improve the grounding characteristics.

In a preferred embodiment, two or more preferably identical electrical conductors extend in parallel to each other in a horizontal direction and at the same level. Consequently, it is possible to undertake a determination of the position of the mobile piece of sports equipment relative to the conductors or the marking line at every position of the arrangement of the conductors, if the marking line runs in parallel to the arrangement of conductors and preferable in between both.

Thereby, the conductors shall be preferably arranged always at the same level to each other so that the plane at which the same field strength of corresponding conductors is present, cuts the surface of the sports field orthogonal to the marking line and therefore also allowing for an exact measurement of the mobile piece of sports equipment in a vertical distance to the marking line.

Since in the boundary area of the conductor, i.e. at the junctions of the current source and the grounding means, distortions or inhomogeneities of the magnetic field may occur, it is imaginable that the conductors extend beyond the length of the actual marking line, in order to obtain in the area of the entire marking line homogeneous magnetic fields and therefore allowing for accurate measurements along the entire length of the marking line.

In case of a soccer field, a goal line as a marking line is of particular interest, in order to determine quickly and simply if a goal was scored.

Thereby, one conductor each at both sides of the individual goal lines may be arranged at one or both goal lines of a soccer field By that, the conductor in front of the goal line causes the sensor inside the ball to detect a stronger magnetic field compared to a conductor behind the goal line. In case the ball is exactly above the goal line, both magnetic fields of the conductors are detected as being of equal strength. In case the ball is inside the goal, that means the conductor behind the goal line is closer to the ball and accordingly its magnetic field at the position of the ball is stronger than the magnetic field of the conductor in front of the goal line. Depending on the rule of the game, it could be reasonable to shift the conductors in a direction relative to the signal line, for example to be able to determine if a ball for example has crossed the line not only with its center but completely.

It is also imaginable to arrange several or even all marking lines of a soccer field with such conductor arrangements, so that for example at the boundary lines of a sports field an "out" of the ball can be registered.

It is further imaginable for example to furnish the goal line with several to each other orthogonal pair-wise arrangements of conductors, for example to determine at which position and height the ball is crossing the goal line.

A further aspect relates to the position of a conductor according to the invention in the area of the goal line. Since a goal is scored only, if the ball has crossed the goal line by a certain fraction, the conductors arranged beneath the goal line must be shifted by a certain amount "away from the sports field". Consequently, both conductors do not extend symmetrically to the goal line but parallel shifted thereto. Since the cross bar is located exactly above the goal line, the conductors are also shifted with respect to the cross bar. If the cross bar is now composed of a conducting material, the magnetic fields generated by the conductors are effected by induction of eddy currents of the cross bar. As the conductors have different distances to the cross bar, hence they are arranged asymmetrically to it, the magnetic fields of the different conductors are affected at different extensities. In other words, magnetic fields are affected in the area of the cross bar differently so that errors in the determination of the position of a ball occur since the strengths of the magnetic fields are measured for said determination of the position.

A further embodiment of the invention causes redress in this respect. Therefore, in case one of the two conductors is generating a magnetic field at the other conductor according to the invention and preferably with respect to form and in particular with respect to the phase congeneric, but with respect to the strength, a weaker magnetic field is generated in order to make the eddy currents induced in the circular profile of the cross bar which eventually are responsible for the interference to the determination of the position in the area of the cross bar, symmetrical.

In order to compensate for the error caused by the eddy fields in the area of the cross bar, it is good if the two fields which are compared with each other are arranged in parallel (or not and parallel, since an alternating field is present and when calculating these fields they are considered to be straight lines having no distinguishing direction). By that the effect becomes symmetrical, since only a comparison of the field strengths is performed. If both fields are distorted in an equal measure, the error gets compensated for.

On the one hand, it is imaginable to minimize the angle by concurrently applying current to the conductors. Thereby, it should be considered that the dynamics of the field in the field direction towards the center of the sports field does not become too low. So, the typical level of magnitude for applying current to the respective other conductor, amounts to approximately 20-40% of the conductor whose field currently is to be measured.

On the other hand, it is imaginable to expand the above mentioned method by means of a multiplex measurement by a simple measurement wherein current is applied to both conductors (see FIG. 8). By using an empirical mathematical method for comparison, the distortion caused by the eddy fields can be deducted. For this, the system needs calibration before bringing it into service. By means of measuring the level of a ball as described in the following, these methods can be switched on for each measurement dynamically, if a critical level (that is proximity to the cross bar) is present. This is accomplished within the matrix inside the control unit. Since the control unit also carries out the analysis (calculation) of the position from the orthogonal field strengths sent out by the sensor, it is also known, if and when whichever method is currently in operation.

A further aspect of the present invention relates to the measurement of the level of a ball relative to the sports field. If the ball is located above two conductors, the ball can calculate its position relative to the conductors by determining the strength of the fields generated by the conductors. Since, with increasing height of the ball above the sports field particularly above the goal line, the angle between the conductors viewed from the ball decreases, the position and thus the level of the ball with respect to the cross bar can be determined.

Figure 9:
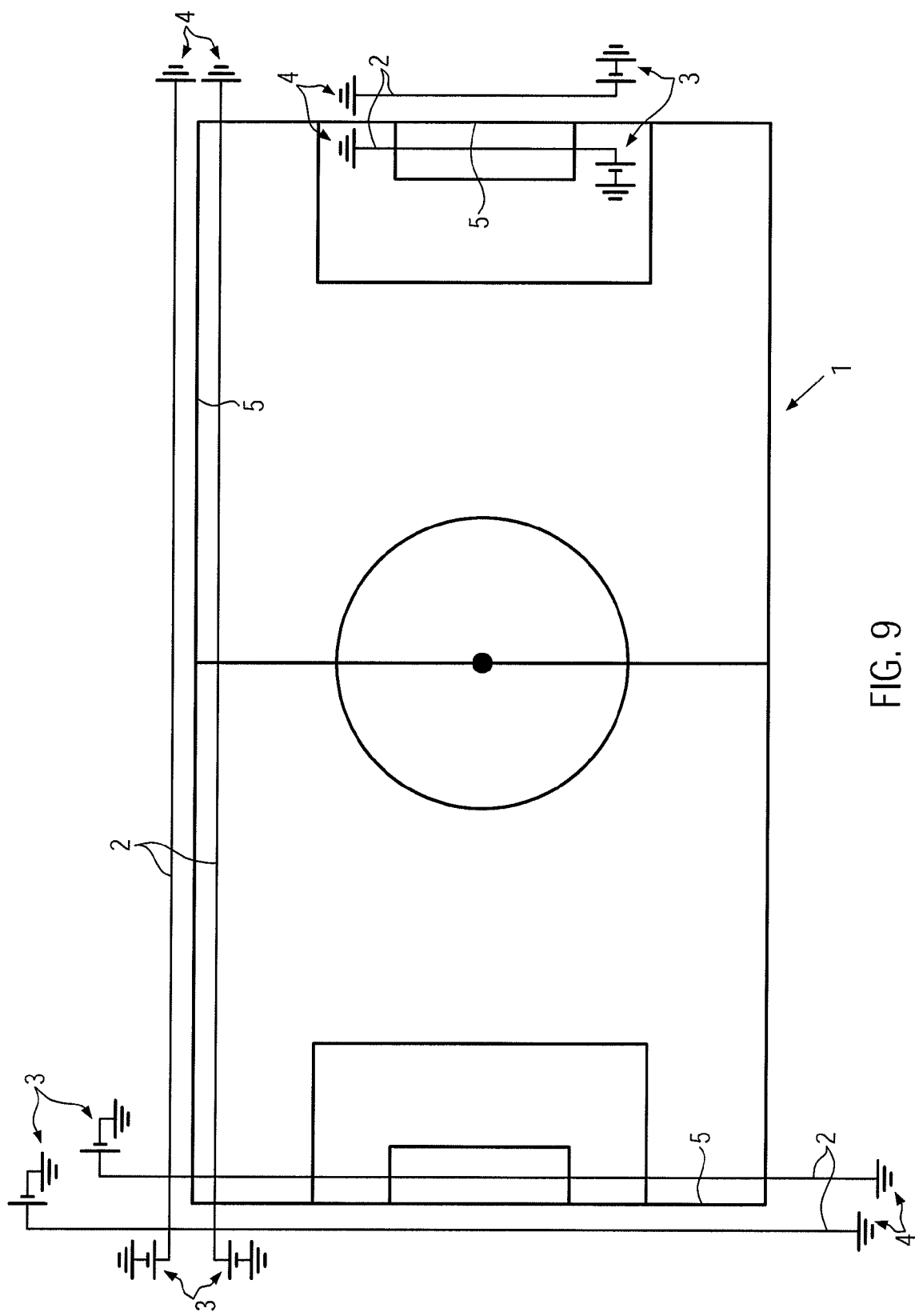
FIG. 9 shows a soccer field with exemplary arrangements of conductors in a top view according to an embodiment.

FIG. 9 shows a soccer field 1 at which exemplary individual marking lines 5 are enclosed by a pair of parallel conductors 2. As one can see, in doing so the conductors 2 extend at every side of the marking lines 5. Thereby, they have the same horizontal distance to the marking line 5 and they extend beyond the actual length of the marking line 5 in order to allow for an accurate measurement of the position of the ball using the magnetic field sensor along the entire length of the marking line 5. Thereby, every conductor is connected both to a grounding means 4 and to a current source 3. Thereby, the current sources 3 could be both individually and in several components of one or more control units, which in turn could be a component of a position determination system of the ball of a game.

Figure 10:
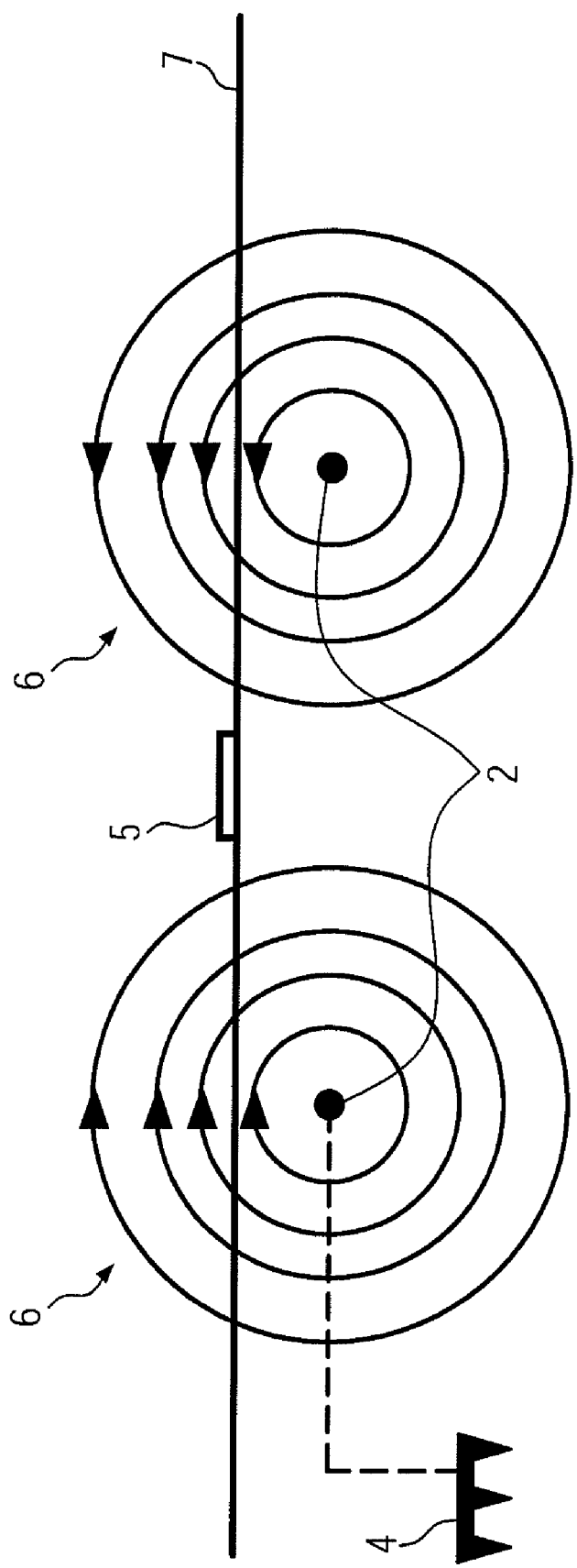
FIG. 10 shows a horizontal sectional view of the surface of the sports field having a marking line and an arrangement of the conductors according to an embodiment.

In FIG. 10 one can see that the conductors 2 extend at every side of a marking line 5. Thereby, they are arranged at the same level, so that the magnetic fields 6 of the conductors 2 have the same strength in a plane cutting a surface of the sports field 7 through a marking line 5. Schematically shown is a grounding means for a conductor 2, with which one of the conductors 2 is grounded to the soil underneath the surface of the sports field 7.

Figure 11:
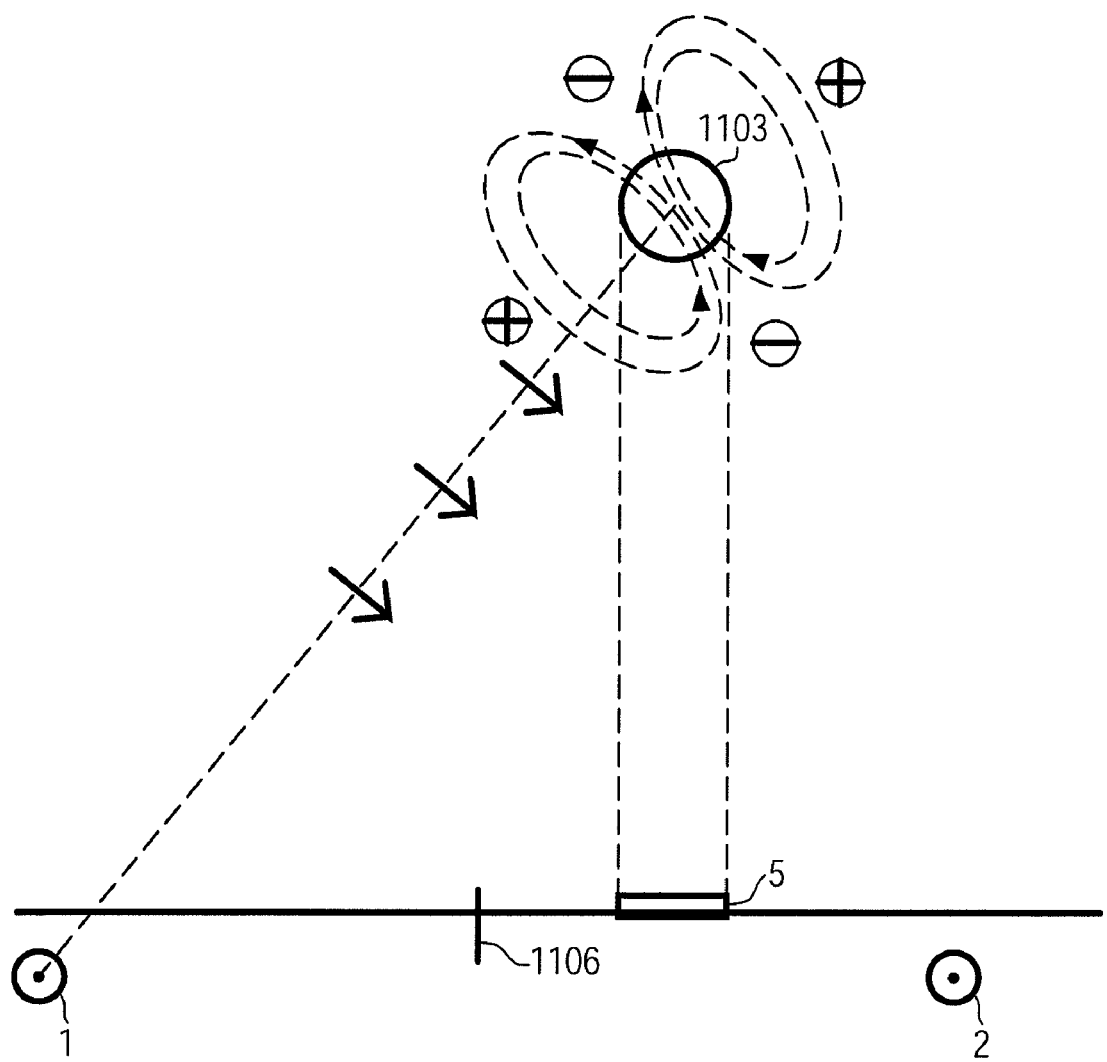
FIG. 11 is a vertical section through the cross bar with shifted conductors according to an embodiment.

FIG. 11 shows a profile of a tubular cross bar made of a metallic material, which is arranged exactly above a goal line 5. Since the goal decision line 1106 has to be arranged within a goal, thus arranged relative to the goal line 5 away from the sports field, conductors 1 and 2 must be shifted by this amount, too. In the shown example, the displacement is 11 cm. Due to the different distances of conductors 1 and 2 from the bar 3, eddy currents of different strengths are induced inside the crossbar 3, interferences to the magnetic fields of different strength occur in the area of the goal conductors 3 and in turn this results in an erroneous determination of the position of the ball in the area of the cross bar 3. In order to compensate for this effect, a similar but with respect to the absolute value a weaker magnetic field, for example an in-phase field but a not so strong one, is generated by means of the respective conductor which is not "measured" at the moment. Thereby, the super-position of the magnetic field strength is determined. The distance of a conductor from the decision line can amount to roughly 0.6 meter to 2.5 meters. Typically, the distance amounts to 1 meter.

Figure 12:
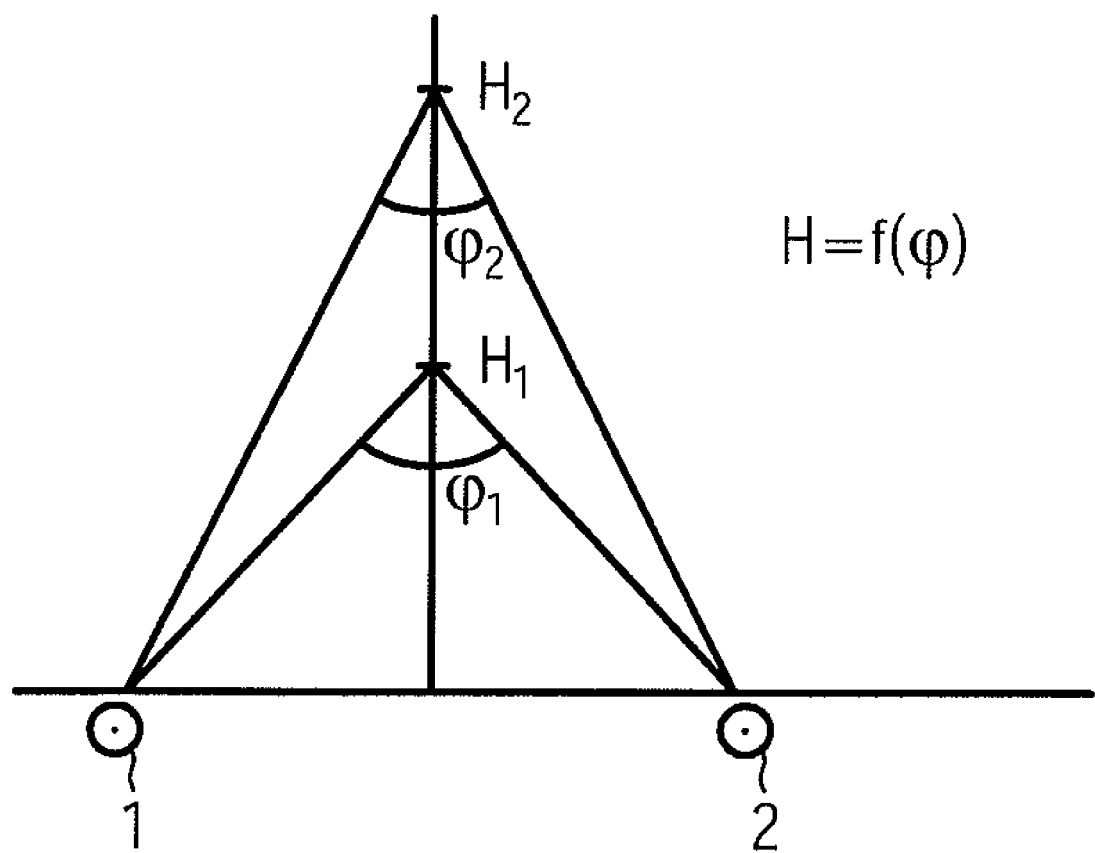
FIG. 12 is a schematically illustrated relationship between the angle φ and the height of the ball H.

FIG. 12 shows schematically the geometric interrelation between the angle φ, which is from the view point of the ball present between the two conductors 1 and 2 and the level H of the ball relative to the sports field.

A further, third aspect of the invention relates to a goal of the sports field having two posts and a cross bar, wherein the posts and the cross bar essentially consist of electrical conductive material, such as for example aluminum.

If electrical conductors for generating a magnetic field are arranged, for example in the area of the goal line, for determining the position of the ball, magnetic field lines generated by the conductors continue through the goal. In case the goal consists essentially of electrical conductive material and if the posts in the area of the surface of the sports field are also electricaloconductive connected, for example through conductive soil or a bracket of the goal extending retral from the goal, the goal constitutes a conductor loop.

Therefore the magnetic field generated by the conductors gets distorted by induced currents inside the goal and an accurate measurement of the position of the ball is no longer possible.

The goal of a sports field according to the invention is characterized by a conducting loop which encompasses at least a part of the sports field goal, said conductor loop being punctuated by at least one electrical non-conductive element.

A conducting loop to be punctuated, may be constituted by the posts and the cross bar and at least a part of the sports field located between the posts. Any other kind of arrangements which are able to constitute a conducting loop, for example the circular bearings of the mesh of the goal extending backwards, could constitute a conducting loop and preferably according to the invention be punctuated by a non-conductive element.

The non-conductive element thereby can be part of the goal, wherein it could be particularly conceivable that it serves as a connecting element between the cross bar and one of the posts or divides the cross bar or one post in its longitudinal extent.

Basically, it is imaginable having one or more non-conductive element in a goal.

The non-conductive element thereby could be also or additionally a part of the sports field. Advantageously, it could be arranged in an area of the sports field situated at a post of the goal, thus being for example a bracket for the posts of the sports field.

The non-conductive element can be made of non-conductive plastic material or a non-conductive fiber composite material or encompass at least one of such, so that individual elements of the conducting loop of the goal are electrically isolated from each other.

It is imaginable that the actual goal is made of essentially or in part of for example aluminum or a different conductive metal and encompasses at least one element made of non-conductive material.

Thereby, the non-conductive element could also be arranged between the sports field and the goal, for example a cladding jacket or coat of paint for one or both posts of the goal at the location at which the post or the posts touch(es) the surface of the sports field or extend beyond the surface into the soil of the sports field.

Figure 13:
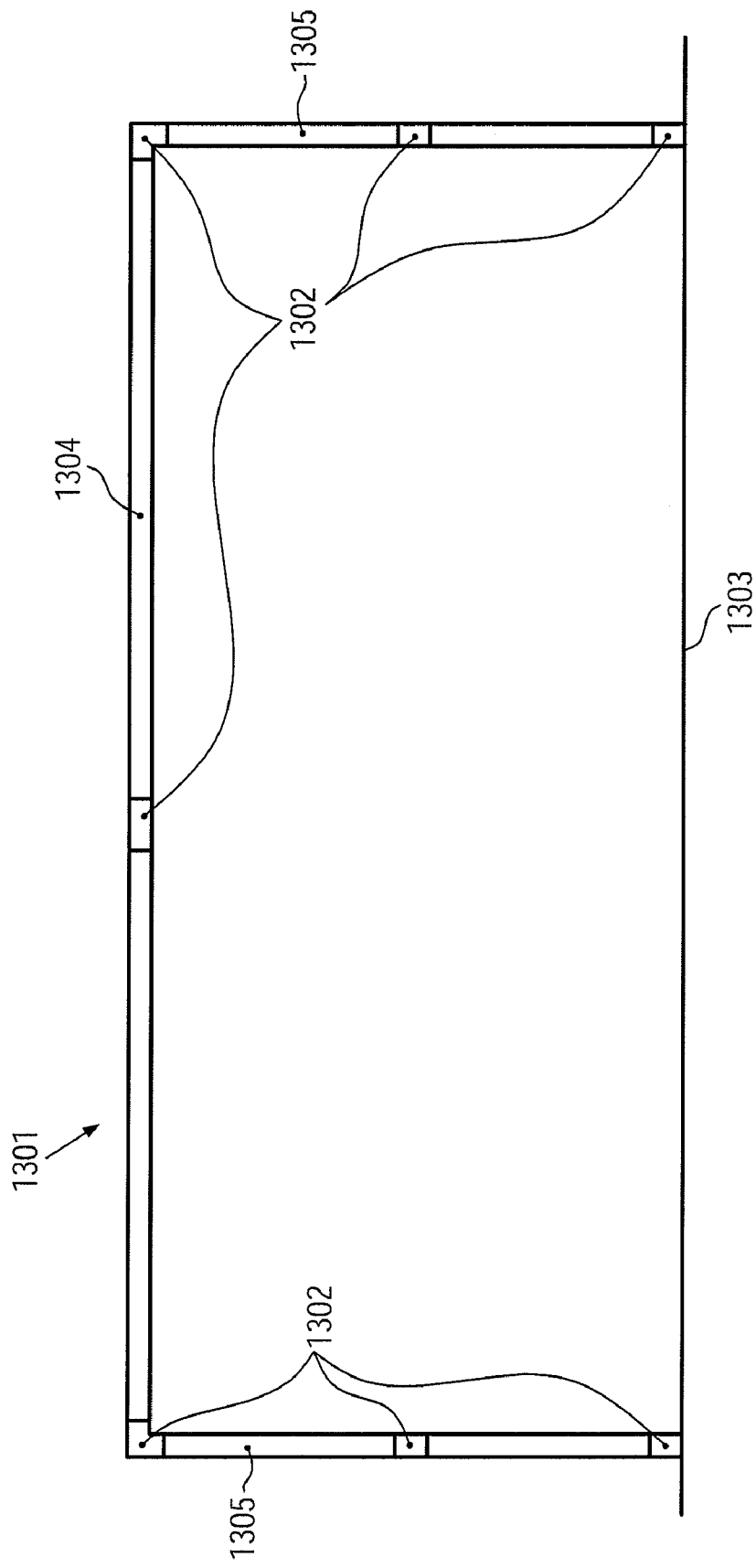
FIG. 13 illustrates a sports field goal in a frontal view according to an embodiment.

FIG. 13 illustrates a sports field goal in a frontal view, comprising two goal posts 1305 and one cross bar 1304. Thereby, posts 1305 extend up to the surface of the sports field 1303. Furthermore, several non-conductive elements 1302 are shown, which could also be located individually at the shown position or at other positions, in order to punctuate the conducting loop formed by the goal and the soil.

The light areas of the posts 1305 and the cross bar 1304 are made of a metal material, for example aluminum but they are not conductively connected with each other by the elements 1302.

In this manner, a magnetic field through the goal cannot be affected by induction, which results in a homogeneous magnetic field generated by conductors arranged at the goal line, for example and which allows for an accurate determination of the position of a ball by means of measuring individual magnetic fields.

A further, fourth aspect of the invention relates to a method and apparatus for laying two parallel conductors for generating magnetic fields.

In order to determine a position of a ball by measuring individual magnetic fields, it is necessary to place the conductors generating the magnetic fields underneath the surface of the sports field to not impede the acting players on the surface of the sports field. It is necessary to lay two conductors beneath the surface of the sports field in an exact parallel arrangement parallel to a marking line. Furthermore, it is necessary that the individual conductors are located at exactly the same height, as otherwise the plane in which the magnetic field strengths of the magnetic field generated by the two conductors are equal, is not orthogonally cutting through the surface of the sports field at the marking line. In this case, a bail positioned not exactly above the marking line would be registered as being exactly above the marking line and vice versa.

This requires a high precision layering of the individual conductors underneath the surface of the sports field.

According to the invention, two parallel conductors for generating magnetic fields are laid by creating at least one notch in the area of the surface of the sports field. However, it is also imaginable that for each conductor an individual notch is created, wherein the notch need not have to have a noteworthy extension across to the direction of laying. Advantageously, the surface of the grass of the sports field is not demolished, as was the case with previously carried out methods.

Afterwards, the conductors are put into the common or each in an individual notch under the surface of the sports field, wherein the position and alignment of each conductor must be determined, in order to assure an exact parallel extension at the same level of the individual conductors.

In case the individual conductors are not exactly parallel and/or extend at the same level, the position and alignment of at least one conductor is varied in such a manner that the conductors extend at the same level and run in parallel to the other conductor and the marking line.

Thereby, it is imaginable to create the notch by means of a grinding wheel. Such a grinding wheel can thereby be placed on a mobile carriage, which is moved in the direction of the to be created notch.

However, it is also imaginable that the notch is created by a longish tool, which is brought perpendicular to the surface into the surface of the sports field or plunged into it. Thereby, a sort of longish scoop can be used in order to create a longish notch underneath the surface of the sports field, that stands perpendicular to the surface of the sports field.

According to a preferred embodiment for example, one of the conductors or every conductor can be attached to a conductor carrier which is itself not electrically conductive and therefore does not cause any distortion to the magnetic fields generated by the conductors. Furthermore, the conductor carrier could be made in such a manner that it is similar to a ruler, flexible only in one plane, and that it does not bend in a plane perpendicular to this plane. Advantageously, the conductor carrier is arranged in such a manner that it is flexible in a horizontal plane parallel to the surface of the sports field.

According to a preferred embodiment, if a deviation of the position and alignment of at least one conductor is determined, the position and alignment of at least one conductor can be accomplished by varying the distance between the conductor carrier and an inflexible backing strip, for example, by twisting at least one screw which is threaded through the backing strip and/or conductor carrier. Also, similar means are imaginable, which provide the same function as such a bolting, for example a latching connection.

It is imaginable that the conductor carrier or backing strip features a thread, wherein the respective other component does not allow for an axial shift of the screw by turning the screw. Thereby, by screwing the screw, the conductor carrier dislodges from the backing strip or approaches the backing strip when screwing in the opposite direction. This way the level of each individual conductor can be adjusted and aligned exactly.

Furthermore, after the conductor has been aligned, one or each notch can be filled by soil or a different material, for example, a material that can be compacted and thereby fixing the conductors inside the notches at its exact parallel and at the same level extending alignment.

Afterwards, it is imaginable that the backing strip is released by dismantling of the connection between backing strip and conductor carrier, for example, by screwing out the screws from the threads of the backing strip or conductor carrier. Thereby, the backing strip extending at least in part above the surface of the sports field can be removed and the remaining components remain entirely underneath the surface of the sports field, thereby not imposing any barrier on the sports field.

In a preferred embodiment for each of two conductors to be laid, two conductor carriers with two corresponding inflexible backing strips are connected to each other. Thereby, the two inflexible backing strips are connected to themselves again, so that the result is a single apparatus. The inserting of both conductors is accomplished by a single apparatus. Thereby, the alignment and position of the individual conductors can be concluded from the alignment of the apparatus.

Further, in case individual pieces of conductors are laid, these pieces can be connected with each other electrical conductively, so that eventually two parallel conductors underneath the surface of the sports field are generated.

An apparatus according to the invention for the laying of two parallel and at the same level extending conductors may comprise two conductor carriers, each being flexible in one plane and at which each one conductor is arranged. Furthermore, the apparatuses may comprise two inflexible backing strips which are connected to a corresponding conductor carrier at, at least one point with variable distance. The distance can thereby be varied by means of a bolted assembly and the connection can eventually be also released by this bolted assembly. However, it is also imaginable to provide a multiplicity of such bolted assemblies, for example if longer segments of conductors need to be laid. Thereby, the apparatus can comprise at least one means with which the position and alignment of the individual conductors to each other can be determined. This could be for example a water level or a means comparable to this, for example an electronic measuring appliance.

The variation of the distance between a backing strip having a conductor and the corresponding backing strip can be varied by means of a connection of these in one point. For example, a bolted assembly can be used, wherein either the backing strip or the conductor carrier are furnished with a thread and the respective other corresponding component disallows any axial shift when turning the screw. However, there are further forms or friction locking means imaginable, which allow for a variation of the distance of the conductors or of the conductor carrier to the backing strip. Thereby, for example, a latching connection is imaginable.

Figure 14:
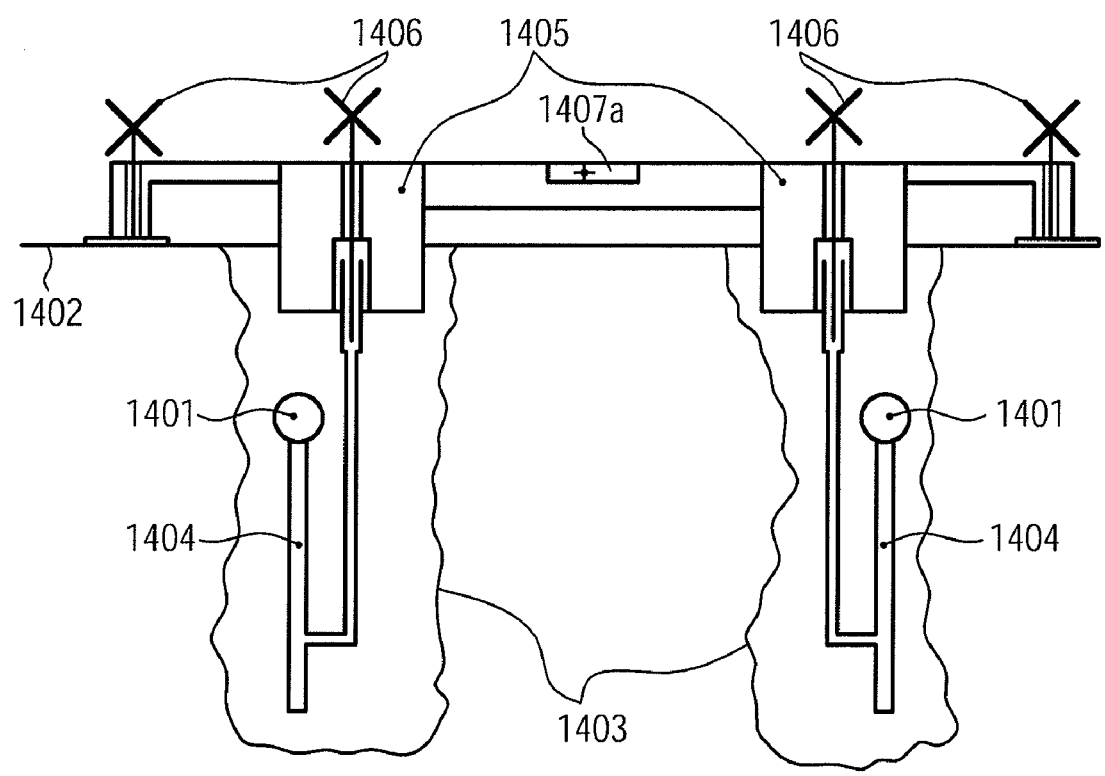
FIG. 14 is a horizontal sectional view of an apparatus according to an embodiment in the direction of the conductors.

As it becomes apparent from FIG. 14, each conductor carrier 1404 bears one conductor 1401 and which by means of the connected backing strips 1405 can be brought into a notch 1403 each underneath the surface of the sports field 1402.

Thereby, the alignment and position of the conductor carrier 1404 together with the conductors 1401 can be varied individually as well as with respect to each other by means of several bolted assemblies 1406. After the alignment and position of conductor 1 comply with the expected result, notches 1403 can get filled with a suited material, causing eventually fixing of the conductor carriers 1404 with the conductors 1401 in the notch. In case the notches exhibit no noteworthy connection across to the direction of the conductors, the conductors can get clamped by the turn over of the notches. A filling of the notches consequently would be not necessary.

Afterwards, the bolted assemblies 1406 could be released, thereby resulting in a release of the backing strips 1405 from the respective conductor carriers 1404. Thereupon, the backing strips 1405 could be detached, wherein merely conductor carrier 1404 with the conductors 1401 remain underneath the surface of the sports field 1402.

The alignment of conductors 1401 or the conductor carriers 1404 can be metered by means of a water level 1407*a*.

Figure 15:
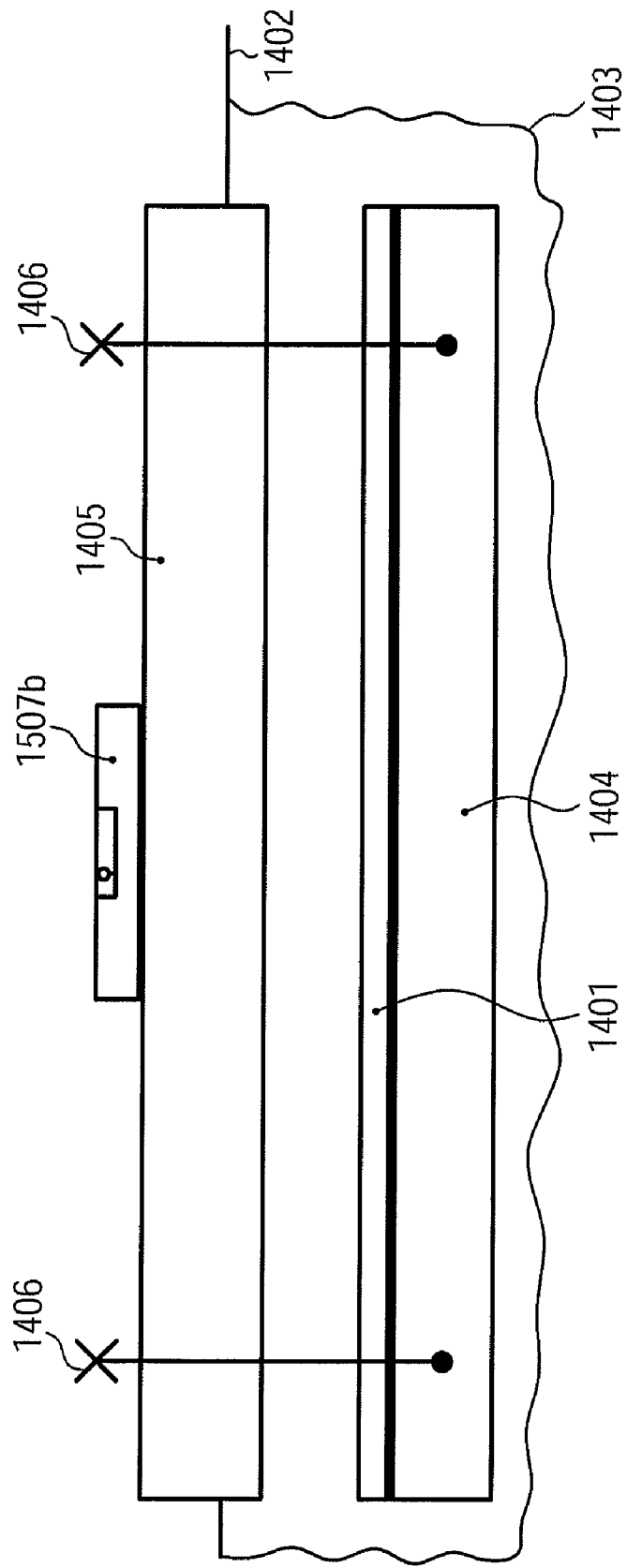
FIG. 15 is a horizontal sectional view of an apparatus according to an embodiment across the direction of the conductors.

FIG. 15 shows a lateral view of the apparatus according to the invention, wherein an additional alignment in longitudinal direction of conductor 1401 by means of a further water level 1507*b* can be metered.

As will be readily appreciated by a person skilled in the art, the conductors in any of the described embodiments may be wires or coils.

A further fifth aspect of the invention relates to a determination of position apparatus for determining the relative position of a movable object to a stationary object. In particular, by means of this apparatus the relative position of a soccer ball to a sports field goal is determined.

In a soccer match, each of the two soccer teams playing against each other attempt to move the ball in an area defined by the up-field goal. Thereby a goal is defined as follows: the ball must cross the goal line within the goal at its full extent. That means, that the ball before crossing the plane spanned by the trailing edges of the goal posts has to be at the internal side with respect to the goal of this plane with its entire extent. Detecting this circumstance bare-eyed is extremely difficult, as shown by the popular "Wembley goal".

Since in particular the area around the goal post is of interest, the invention features at least two field-generating appliances each of which generate a field, where the strength in space can be measured by means of a sensor. For example, if the sensor is located inside the ball, the sensor position and thereby also the position of the ball relative to the individual field generating appliances can be determined on the basis of the measured field strengths of the individual fields.

In case the field generating appliances are arranged stationary, opposite of a goal post, the position of the ball relative to the goal post can be determined as well. In particular, one can state with certainty if a ball of a goal kick was kicked passing by the goal post on the left or right hand side and consequently whether a goal was scored or not.

In a preferred embodiment, the field-generating appliances consist of magnetic field coils, which are arranged in an area of the goal post averted from the sports field, thus they are arranged "behind" the goal post. Thereby, a magnetic field coil may be arranged on each on the left and right behind the goal post so that the area around the actual goal remains clear of the magnetic field coils and consequently no players are impeded. Thereby, it is imaginable that the magnetic field coils exhibit the same distance to the goal post, so that this "symmetrical" arrangement allowing an accurate determination of the position of the ball.

Further it is imaginable that the axes of the coils, in other words, the axes of rotation of the magnetic field coils extend parallel to the goal posts and also exhibit the same distance to a goal line in the area of the goal post. Thereby, one can achieve that, in the case of a perpendicular frontal view to the goal post, from a point of view from the sports field, there will be generated to the left and the right behind the goal post two exactly equaling magnetic fields in a symmetric arrangement.

The profile of the coils needs not necessarily be axially symmetric but could also exhibit other profile forms, in particular a rectangular form. The number of turns of the coil is arbitrary, and can thus be reduced down to one turn (N=1). It is only important that to the left and right of the goal post, magnetic fields are generated which are symmetric to each other, since for the determination of the position in the area of the goal post a comparison of the field strength by the sensor inside the ball is carried out.

Thereby it is further imaginable that the magnetic field coils with respect to their heights extend beyond the upper end of the goal post.

Further, the invention relates to a sports field goal, wherein at each goal post, one position determination apparatus according to the invention is arranged. Therefore, one can determine if the ball has been kicked between the two goal posts or if it has passed by the goal to the left or to the right.

Since the magnetic field strength drops off to the outside relatively quickly, the magnetic fields of the two behind the two goal posts arranged position determination apparatuses are not affecting each other. Therefore it is imaginable that for example the coils positioned "outside", i.e. the coils arranged to the left and to the right next to the goal are switched together. The same applies for the magnetic field coils located "inside". Since the sensor distinguishes the individual magnetic fields by means of defined characteristics of the individual magnet fields, for example, temporal characteristics, in case of an arrangement comprising interconnected coils, indeed, it is not possible to determine if the ball was kicked across the goal to the left or to the right if the magnetic coils are connected together, but it is sufficient if one can tell if the ball was kicked across the goal to the left or to the right or in between the posts and into the goal.

Figure 16:
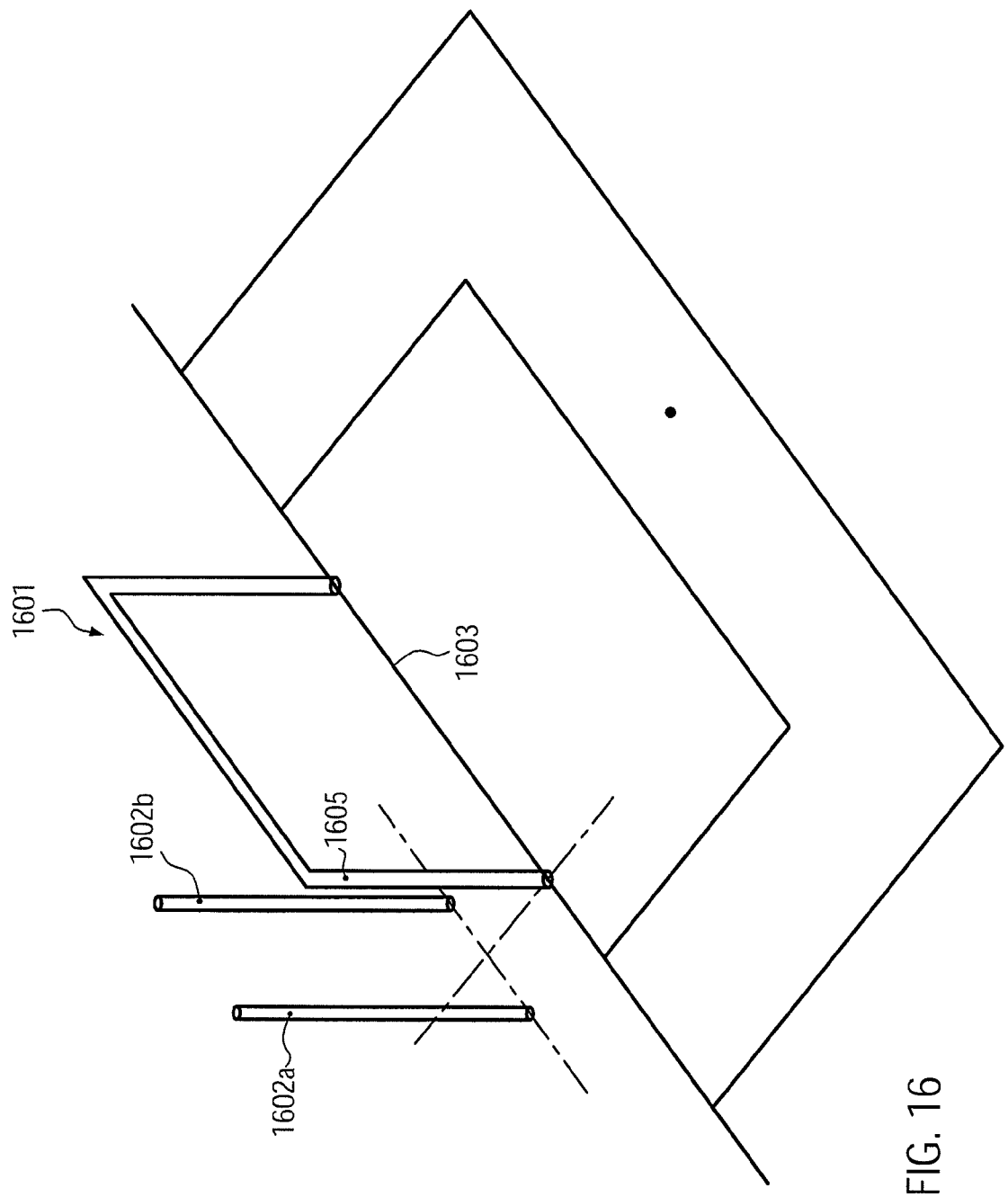
FIG. 16 is a perspective view of a sports field goal with magnetic field coils arranged behind the left goal post according to an embodiment.

FIG. 16 shows a sports field goal 1601, which is located on a goal line 1603. Thereby, exemplary magnetic field coils 1602*a* and 1602*b* are arranged to the left and to the right behind the goal post 1605, the magnetic field coils are thereby arranged symmetrically behind the goal post 1605, hence, they exhibit the same distance to goal post 1605 and the same distance to goal line 1603. Furthermore, the magnetic field coils extend in parallel to the goal post 1605. In the shown embodiment, the magnetic field coils have a diameter of approximately 1.5 mm and are embedded into glass fiber material. The distance between the magnetic field coils 1602*a* and 1602*b* amounts to approximately 70 cm to 1 meter and the distance of the magnetic field coils to the goal line amounts thereby 1.5 to 2 meters.

Figure 17:
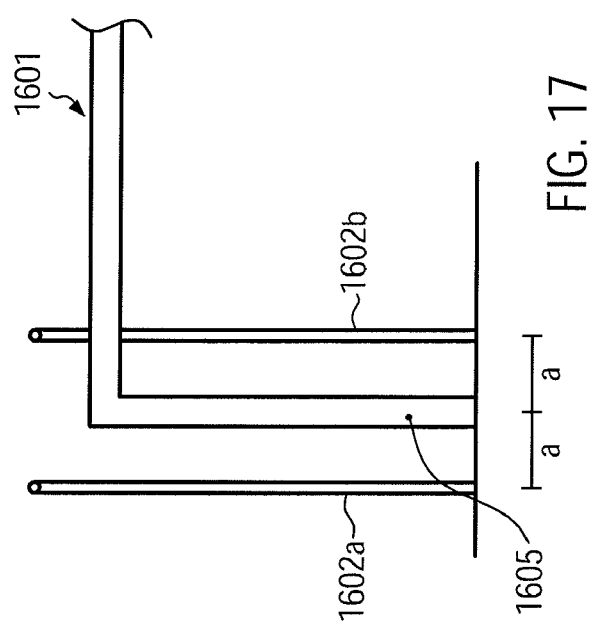
FIG. 17 is a perpendicular frontal view to a sports field post with magnetic field coils arranged behind according to an embodiment.

FIG. 17 shows in a frontal perpendicular view on the goal post 1605 and magnetic field coils 1602*a* and 1602*b*, related to goal post 1605, which are arranged behind the goal post 1605. One can see in particular, that these magnetic field coils 1602*a* and 1602*b* extend beyond the actually height of the goal, so that the magnetic field or the magnetic fields are generated over the entire length of the post, which allow for an accurate determination of the position of the ball along the entire height of the goal.

Figure 18:
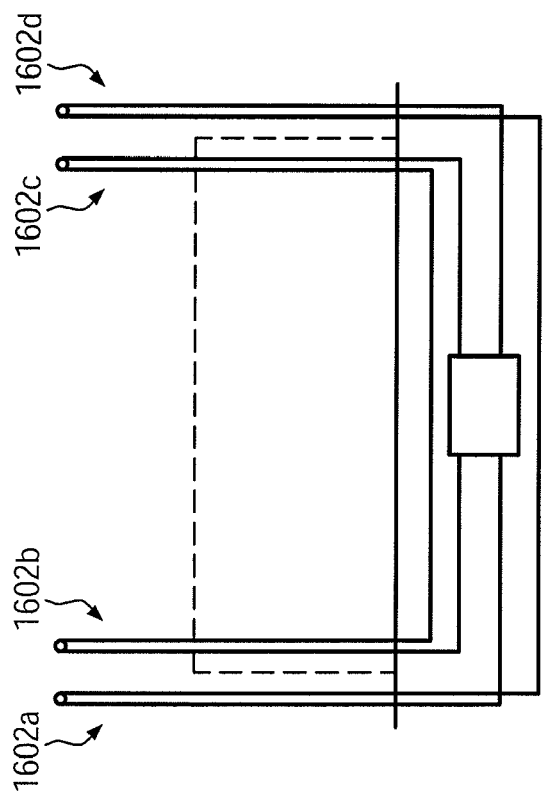
FIG. 18 is a schematic drawing of the coil circuitry according to an embodiment.

FIG. 18 shows schematically goal posts 1602*a*, 1602*b*, 1602*c* and 1602*d*. Thereby, the magnetic coils 1602*a* and 1602*d* are connected in series, wherein the magnetic field coils 1602*b* and 1602*c* are connected in series likewise. Such circuitry allows evidence if the ball was kicked across the goal to the left or to the right, or was kicked in between the goal posts which is consequently sufficient for the decision of whether a goal was scored or not. This circuitry is possible because the magnetic fields of coils 1602*a* and 1602*b* are not affected by the magnetic fields of coils 1602*c* and 1602*d* and vice versa.

Figure 19B:
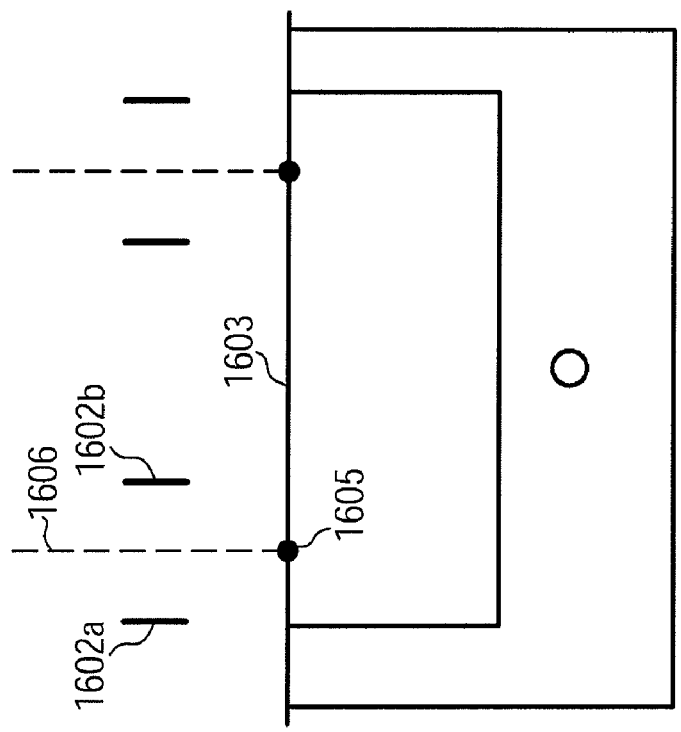
FIG. 19b is a top view to the area of the goal of a sports field wherein the coils are aligned perpendicular to the goal line according to an embodiment.
Figure 19A:
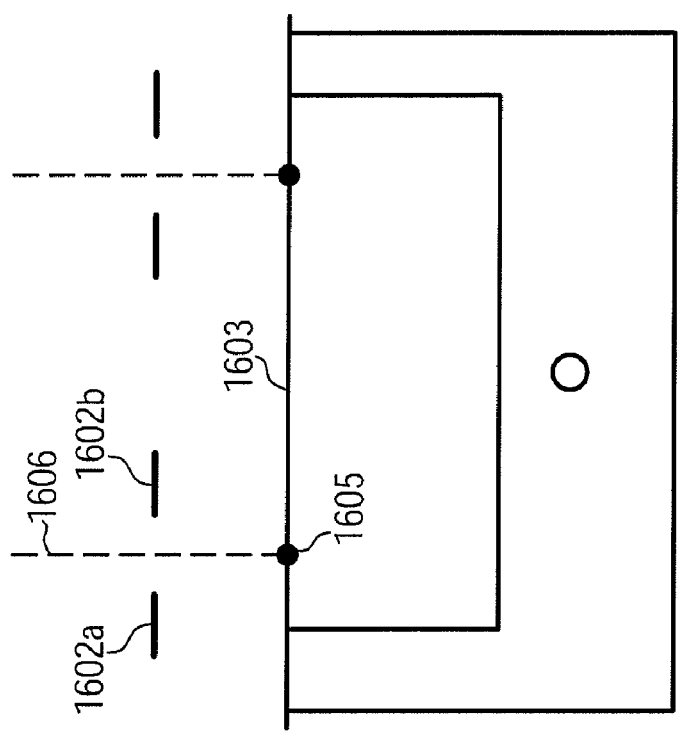
FIG. 19a is a top view to the area of the goal of a sports field wherein the coils are aligned in parallel to the goal line according to an embodiment.

From FIGS. 19a and 19b, one can see that the arrangement of the coil pairs 1602a and 1602b behind the post 1605 assigned to it, do not play any role for the present invention. It is merely important that the field strength exhibits the same field strength of the magnetic fields generated by coils 1602a and 1602b in plane 1606. Hence, a determination of the position by means of the sensor inside the ball is possible by comparison of the magnetic field strength of the two magnetic fields. In case the sensor inside the ball measures at the field of coil 1602a a larger field strength as is the case at the field of coils 1602b, it is suggested that the ball is located closer to coil 1602a hence to the left of plane 1606. In case the field of coil 1602b is larger, the ball is located to the left of plane 1606. In case the measured field strength of both fields are equal, it is suggested that the ball is located on the plane 1606.

Figure 20:
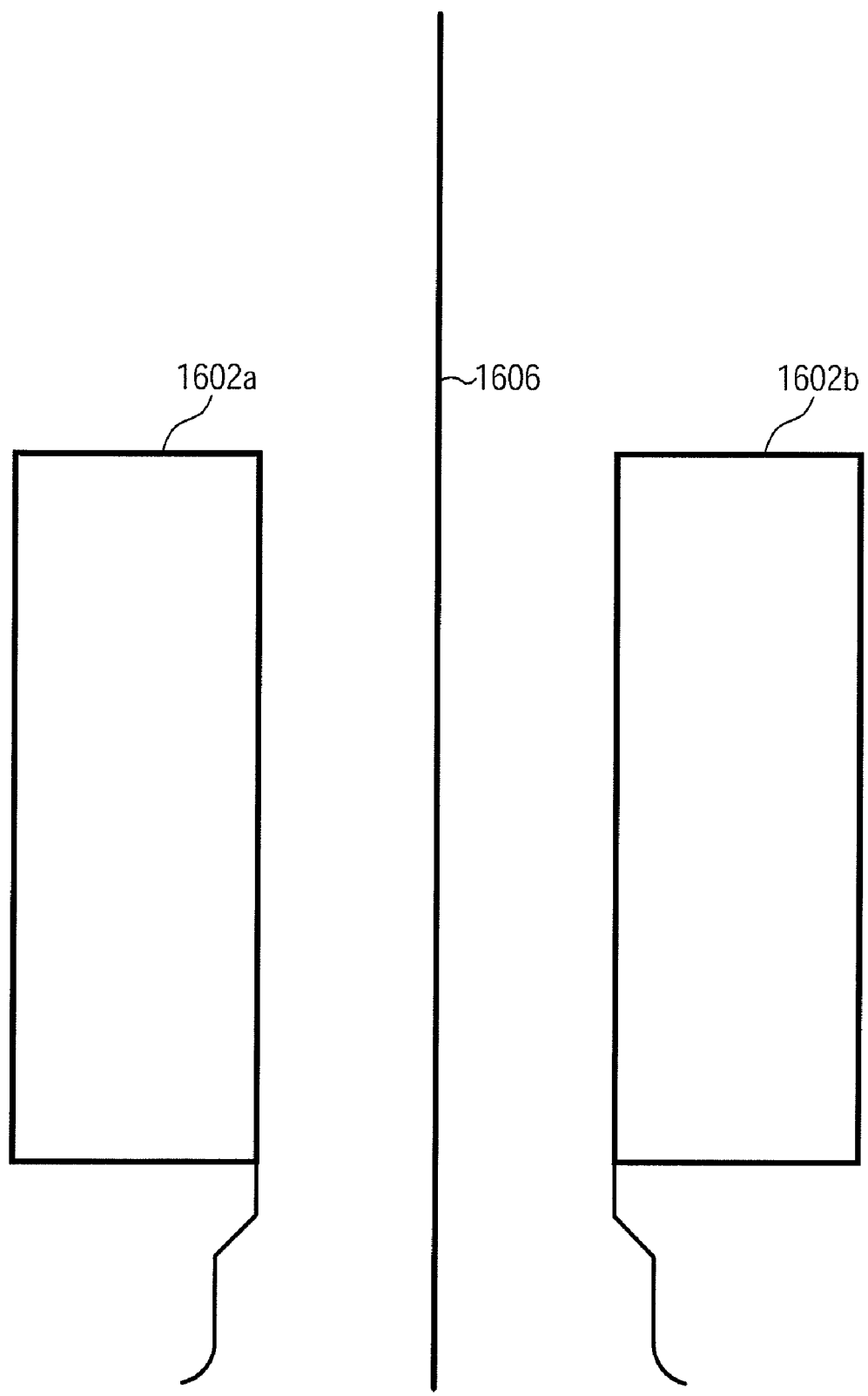
FIG. 20 is a fontal view on a rectangular pair of coils left and right of the plane in which the same field strength of the fields prevails according to an embodiment.

FIG. 20 shows two rectangular coils 1602a and 1602b, which are arranged symmetrically to the goal posts. Plane 1606 spans between the coils 1602a and 1602b, at which exactly the same field strength of the magnetic fields generated by coils 1602a and 1602b prevails. Typically, the coils could exhibit thereby a height of 2 meters and a width of 0.5 meters and are located 1.5 meters behind the goal. Since a soccer ball exhibits a diameter of 22 cm and a goal post typically exhibits a diameter of 10 cm, the maximum possible difference between a goal kick which passed by the goal and one kicked inside the goal amounts to approximately 32 cm, since the magnetic field sensor inside the ball is typically arranged in the center of the ball.

The following is a list of embodiments setting out groups of features and combinations thereof that may be present according to the invention:

Embodiment 1: A method for analyzing magnetic fields or signals used for determining the position of an object, wherein two temporal shifted magnetic signals or fields are generated by two conductors, which are at least partially or completely separate arranged from each other, wherein the magnetic fields generated consecutively by the conductors are captured by at least one and preferably three preferable orthogonal arranged sensors and wherein information for the determination of the position of the object bearing said sensors relatively to the conductors is determined from the captured signals.

Embodiment 2: The method of embodiment 1, wherein the signal ($W_i$) or the magnetic field strength are measured in periodic intervals and the difference of the field strength of consecutive measurements ($W_i - W_{i+1}$) is determined, wherein the absolute value of said difference is compared to a threshold value to determine if an activated external alternating field is present and if the analysis or measurement is to be activated or triggered.

Embodiment 3: The method according to one of embodiments 1 to 2, wherein that measurement value is used as a trigger signal, which is larger than a predetermined trigger value threshold.

Embodiment 4: The method according to one of embodiments 1 to 3, wherein the signal or field captured by the at least one sensor gets preferably filtered after conversion into an electrical voltage, in order to filter out a predetermined frequency from the signal.

Embodiment 5: The method according to one of embodiments 1 to 4, wherein N+1 measurements are carried out per direction in space, wherein N is an odd number.

Embodiment 6: The method according to one of embodiments 1 to 5, wherein an amplitude A1 is calculated using the measurement values $W_i$ after activation using the formula $$A1 = \frac{\sum_{i=1}^{N} \text{ABS}(W_i - W_{i+1})}{N}.$$

Embodiment 7: The method according to one of embodiments 1 to 6, wherein an amplitude A2 is calculated using the measurement values $W_i$ after activation using the formula $$A2 = \text{MAX}(\{W_i\}) - \text{MIN}(\{W_i\}),$$

where $i \leq 1 \leq N$.

Embodiment 8: The method according to one of embodiments 1 to 7, wherein an amplitude A3 is calculated using the measurement values $W_i$ after activation using the formula $$A3 = \text{ABS}(\text{MAX}\{W_i - W_{i+1}\}) + \text{ABS}(\text{MIN}\{W_i - W_{i+1}\}),$$

where $i \leq 1 \leq N$.

Embodiment 9: The method according to one of embodiments 1 to 8, wherein a combination of the amplitude values A1, A2 and/or A3 is used as AMP in order to determine the position of the object relative to the conductors, wherein $$\text{AMP} = (\text{Factor1} * A1) + (\text{Factor2} * A2) + (\text{Factor3} * A3).$$

Embodiment 10: The method according to embodiment 9, wherein at least one of the amplitude values AMP1 and AMP2 is used, in order to determine the position of the object wherein:

$$\text{AMP1} = (\text{Factor1} * A1) + (\text{Factor3} * A3)$$

$$\text{AMP2} = (\text{Factor2} * A2) + (\text{Factor3} * A3)$$

Embodiment 11: The method according to one of embodiments 1 to 10, wherein one of the amplitude values A1, A2, A3, AMP, AMP1 and AMP2 of a first conductor is compared with another preferably temporally shifted amplitude value A1, A2, A3, AMP, AMP1 and AMP2 of another conductor in order to determine if the object or the sensor inside the object is closer to the first conductor or closer to the second conductor.

Embodiment 12: An apparatus adapted to perform the method according to one of embodiments 1 to 11 having at least one sensor, preferably three sensors placed orthogonal to each other, which are preferably adapted to measure a magnetic field and which are made of Hall-sensors or are made by magneto resistive elements or are made of coils and which are integrated together with an evaluation electronics and a transmitter in a piece of sports equipment or ball, preferably centered, in order to determine if the ball is closer to a first or closer to a second conductor, said conductors generating temporally shifted signals or magnetic fields.

Embodiment 13: An electrical conductor for generating a magnetic field, preferably on a sports field wherein the conductor is connected to a power source, wherein the at least one end of the conductor which is averted to the connection with the current source is electronically connected to grounding means.

Embodiment 14: The electrical conductor according to embodiment 13, wherein the conductor in length is electrically isolated from its environment.

Embodiment 15: The electrical conductor according to one of embodiments 13 to 14, wherein the conductor is placed in soil, preferably underneath the surface of the sports field.

Embodiment 16: The electrical conductor according to one of embodiments 13 to 15, wherein the conductor is flexible.

Embodiment 17: The electrical conductor according to one of embodiments 13 to 16, wherein the grounding means comprises at least one formation extending underneath the surface of the sports field, in particular a ground anchor.

Embodiment 18: An arrangement of at least two electrical conductors, wherein at least one conductor is formed according to one of embodiments 13 to 17, and wherein the conductors are placed parallel to each other, in particular, standing horizontally to each other.

Embodiment 19: An arrangement of two electrical conductors, wherein both conductors are formed according to one of embodiments 13 to 17, and wherein both conductors are placed parallel to each other, preferably extending horizontally.

Embodiment 20: An arrangement of at least two electrical conductors according to one of embodiments 13 to 17, wherein the conductors are placed at the same level.

Embodiment 21: An arrangement of at least two electrical conductors according to one of embodiments 13 to 17, wherein on the sports field at each side of at least one marking line at least one conductor is placed at the same horizontal distance to said marking line.

Embodiment 22: An arrangement of at least two electrical conductors according embodiment 21, wherein the conductors extend beyond the length of the marking line.

Embodiment 23: A marking line, preferably of a soccer field, wherein at each side of the marking line an electrical conductor, according to embodiments 13 to 17, is placed and wherein the conductors have the same horizontal distance to the marking line and extend horizontally and at the same level in parallel, in particular beyond the length of the marking line.

Embodiment 24: A goal line, preferably of a soccer field wherein at each side of the goal line an electrical conductor, according to embodiments 13 to 17, is placed and wherein the conductors have in the same horizontal distance to the goal line and extend horizontally and at the same level in parallel, in particular beyond the length of the goal line.

Embodiment 25: A soccer field having multiple marking lines, wherein in at least one sector of at least one marking line an electrical conductor, according to embodiments 13 to 17, is placed on each side of the marking line and wherein the conductors have the same horizontal distance to the marking line and extend horizontally and at the same level in parallel, particularly beyond the length of the corresponding marking line.

Embodiment 26: A soccer field having at least one goal line, wherein at least one goal line on each side of the at least one goal line an electrical conductor is placed according to embodiments 13 to 17 and wherein the conductors have the same horizontal distance to the goal line and extend horizontally and at the same level in parallel, in particular beyond the length of the goal line.

Embodiment 27: An arrangement according to one of embodiments 18 to 20 and 22, wherein the conductors have a different distance to the marking line, in particular both conductors being shifted horizontally towards the marking line.

Embodiment 28: A goal of a sports field having two posts and a crossbar, wherein the posts and the crossbar are composed essentially of electrical conductive material and wherein the posts extend essentially at least to the surface of the sports field, characterized by a conductor loop which encompasses at least a part of the sports field goal, said conductor loop being punctuated by at least one electrical non-conductive element.

Embodiment 29: The sports field goal according to embodiment 28 wherein the conductor loop encompasses and in particular is composed of the posts, the crossbar and at least a part of the sports field arranged between the posts.

Embodiment 30: The sports field goal according to embodiments 28 or 29, wherein the at least one non-conductive element is part of the sports field goal in particular a connecting element arranged in between one post and the crossbar or an element which is dividing a post or the crossbar.

Embodiment 31: The sports field goal according to embodiment 28 or 29, wherein the at least one non-conductive element is part of the sports field, which in particular is arranged in an area of the sports field adjacent to a post and in particular a bracket of the post.

Embodiment 32: The sports field goal according to one of embodiments 28 to 31, wherein the at least one non-conductive element comprises plastic material or fiber composite material, in particular fiberglass composite material.

Embodiment 33: The sports field goal according to one of embodiments 28 to 32, wherein the goal within the area of the conductor loop is in part, specifically predominantly, made of at least one conductive material, in particular aluminum, and at least one non-conductive material, in particular a plastic material.

Embodiment 34: The sports field goal according to one of embodiments 28 to 33, wherein the at least one non-conductive element is surrounding at least the area of a post arranged underneath the surface of the sports field and is in particular a non-conductive cladding, jacket, coating or coat of paint.

Embodiment 35: A method for laying two parallel conductors for generating magnetic fields, in particular underneath the surface of a sports field, comprising the steps of:

creating at least one notch in the area of the surface of the sports field, in particular of the surface of the grass, laying the conductor into the notch underneath the surface of the sports field, determining the positions and alignments of the conductors to each other in a way that they extend parallel to each other and at the same level, varying the positions and alignments of at least one conductor, so that the conductor extends parallel and at the same level to the other conductor.

Embodiment 36: The method of embodiment 35, wherein the notch is generated by a grinding wheel which is placed in particular on a mobile carriage.

Embodiment 37: The method of embodiment 35, wherein the notch is generated by a tool extending in a plane and wherein the tool is moved on the plane translational perpendicular to the surface of the sports field, so that at the end of the movement one flange of the tool is disposed underneath the surface of the sports field.

Embodiment 38: The method according to one of embodiments 35 to 37, wherein at least one conductor is arranged at a conductor carrier which is flexible in a plane, the conductor carrier being made of electrical non-conductive material, in particular of plastic material.

Embodiment 39: The method according to one of embodiments 35 to 38, wherein the variation of the position and alignment of at least one conductor is accomplished by varying the distance between the conductor carrier and an inflexible backing strip by twisting of a screw which is threaded through the conductor carrier and/or the backing strip.

Embodiment 40: The method according to one of embodiments 35 to 39, wherein the cable carrier is furthermore fixed by filling the notch with soil or a different material in the area of the surface of the sports field.

Embodiment 41: The method according to one of embodiments 35 to 40, wherein the conductor carrier is released from the backing strip by unscrewing the at least one screw from the thread or threads of the conductor carrier and the backing strip.

Embodiment 42: The method according to one of embodiments 35 to 41, wherein several, in particular two pieces of conductors are laid, extending along two sides of a sports field line in the same distance in parallel and wherein the shared plump line runs horizontally along the longitudinal axes of the pieces of conductors Embodiment 43: The method according to one of the embodiments 35 to 42 for laying two parallel pieces of conductors which extend on the same level, for generating magnetic fields, particularly underneath a surface of a sports field, comprising the following steps:
- generating of two notches in the area of the surface of the sports field, particularly the surface of the grass,
- attaching of two flexible pieces of conductors (1) at two conductor carriers which are to one plane flexible,
- connecting the conductor carriers with two inflexible backing strips at least two points, wherein at least one point of a conductor carrier the distance to a corresponding backing strip can be varied,
- placing the conductor carriers together with the conductors into the notches underneath the surface of the sports field,
- determining of positions and alignments of the conductors to each other, so that they extend parallel to each other and at the same level,
- varying the distance of at least one conductor carrier to the corresponding backing strip at least one point, in particular so that the piece of conductor extends parallel to the other piece of conductor and at the same level,
- fixing the conductor carriers into the notches underneath the surface of the sports field,
- dissolving the connection between the conductor carriers and the backing strip,
- removing the backing strips,
- establishing of an electrical contact between several laid pieces of corresponding conductors.

Embodiment 44: An apparatus for laying of two parallel and on the same level extending conductors for generating magnetic fields, in particular underneath a surface of a sports field, comprising:
- two with respect to one plane flexible conductor carriers, at each of the conductor carriers being placed one conductor,
- two inflexible backing strips, each of the two backing strips being detachable connected at least one point with a corresponding conductor carrier in variable distance, in particular by using a bolted assembly,
- at least one means, with which the position and alignment of the conductors is determined,
- at least one means, with which the distance of the conductors to the backing strips in at least one point is varied.

Embodiment 45: An apparatus of embodiment 44, wherein the at least one means, with which the position and alignment of the conductors is determined consists of a water level or a similar electronic appliance.

Embodiment 46: An apparatus of embodiment 44, wherein the at least one means, with which the distance of at least one conductor to the backing strips in at least on point is varied, and consists of a grinding or form locking means, in particular a bolted assembly.

Embodiment 47: A determination of position apparatus for determining the relative position of a movable object to a stationary object, with at least two field generating appliances, each generating a measurable field.

Embodiment 48: The determination of position apparatus of embodiment 47, wherein the movable object is a mobile piece of sports equipment, in particular a soccer ball, and/or the stationary object is a target object of a sports field, in particular a goal post.

Embodiment 49: The determination of position apparatus of embodiment 48, wherein in an area of the goal post adverted from the sports field at two sides of the goal post in the same distance one field generation apparatus each, in particular a magnetic field coil, is placed.

Embodiment 50: The determination of position apparatus according to embodiment 49, wherein the magnetic field coils are arranged so that the axes of the coils are parallel to the goal posts and having the same distance to one goal line in the area of the goal post.

Embodiment 51: The determination of position apparatus according to one of embodiments 47 to 50, wherein the generated fields are symmetrical with respect to a plane through the goal post perpendicular to a goal line.

Embodiment 52: The determination of position apparatus according to one of embodiments 47 to 51, wherein the field generation apparatuses extend beyond the top end of the goal post, in order to generate an homogeneous field along the complete height of the goal post.

Embodiment 53: A goal of a sports field with two goal posts, wherein each goal post is assigned a position determination apparatus, each according to one of the embodiments 47 to 52.

Embodiment 54: The goal of a sports field of embodiment 53, wherein the field generation apparatuses, which are arranged outside with respect to a frontal view of the goal, are controlled together, in particular parallel, and/or the field generation apparatuses, which are arranged inside with respect to a frontal view of the goal, are controlled together, in particular parallel.

Embodiment 55: A position determination method at which with a position determination apparatus according to one of embodiments 47 to 52 the field strength is measured component by component in three directions in space of a multiplex cycle.

Embodiment 56: The method according to embodiment 55, wherein angular measurements are carried out between the individually measured fields.

While the invention has been described with respect to the physical embodiments constructed in accordance therewith, it will be apparent to those skilled in the art that various modifications, variations and improvements of the present invention may be made in the light of the above teachings and within the purview of the appended claims without departing from the spirit and intended scope of the invention. In addition, those areas in which it is believed that those of ordinary skill in the art are familiar have not been described herein in order to not unnecessarily obscure the invention described herein. Accordingly, it is to be understood that the invention is not to be limited by the specific illustrative embodiments, but only by the scope of the appended claims.

What is claimed is:

1. A method for analyzing magnetic fields or signals used for determining a position of an object, the method comprising:
   generating, by two or more conductors, two or more temporal shifted magnetic fields or signals, the two or more conductors arranged separately from each other;

capturing, by at least one sensor, the magnetic fields or signals generated consecutively by the two or more conductors; and determining the position of the object bearing the at least one sensor relative to the conductors from the fields or signals, wherein determining the position of the comprises:

measuring a signal ($W_i$) or the magnetic field strength in periodic intervals;

determining a difference of the field strength of consecutive signal measurements ($W_i$-$W_{i+1}$).

2. The method of claim 1, wherein generating, by two or more conductors, two or more temporal shifted magnetic fields or signals, the two or more conductors arranged separately from each other comprises completely separating the two or more conductors from each other.

3. The method of claim 1, wherein generating, by two or more conductors, two or more temporal shifted magnetic fields or signals, the two or more conductors arranged separately from each other comprises partially separating the two or more conductors from each other.

4. The method of claim 1, wherein capturing, by at least one sensor, the magnetic fields or signals generated consecutively by the two or more conductors comprises laying out two or more sensors orthogonally.

5. The method of claim 1, comprising determining a presence of an external alternating field when the absolute value of the difference is above a defined value.

6. A method for analyzing magnetic fields or signals used for determining a position of an object, the method comprising:

generating, by two or more conductors, two or more temporal shifted magnetic fields or signals, the two or more conductors arranged separately from each other;

capturing, by at least one sensor, the magnetic fields or signals generated consecutively by the two or more conductors;

determining the position of the object bearing the at least one sensor relative to the conductors from the fields or signals, wherein determining the position of the object comprises:

measuring a signal ($W_i$) or the magnetic field strength in periodic intervals;

determining a difference of the field strength of consecutive signal measurements ($W_i$-$W_{i+1}$);

performing N+1 measurements per direction in space, wherein N is an odd number; and calculating an amplitude A1 of the signal through the measurement values $W_i$ using the formula $$A1 = \frac{\sum_{i=1}^{N} \text{ABS}(W_i - W_{i+1})}{N}.$$

7. The method according to claim 6, further comprising: calculating an amplitude A2 of the signal through the measurement values $W_i$ using the formula $$A2 = \text{MAX}(\{W_i\}) - \text{MIN}(\{W_i\}),$$

where $i \leq 1 \leq N$.

8. The method according to claim 7, further comprising: calculating an amplitude A3 of the signal through the measurement values $W_i$ using the formula, $$A3 = ABS(\text{MAX}\{W_i - W_{i+1}\}) + ABS(\text{MIN}\{W_i - W_{i+1}\}),$$

where $i \leq 1 \leq N$.

9. The method according to claim 8, wherein a combination of the amplitudes A1, A2 and/or A3 are used as AMP in order to determine the position of the object relative to the conductors, wherein $$AMP = (\text{Factor1} * A1) + (\text{Factor2} * A2) + (\text{Factor3} * A3),$$

where Factor1, Factor2 and Factor3 normalize AMP.

10. The method according to claim 9, wherein at least one of an amplitude AMP1 and AMP2 is used, in order to determine the position of the object wherein:

$$AMP1 = (\text{Factor1} * A1) + (\text{Factor3} * A3)$$

$$AMP2 = (\text{Factor2} * A2) + (\text{Factor3} * A3).$$

11. The method according to claim 10, wherein one of the amplitudes A1, A2, A3, AMP, AMP1 and AMP2 of a first conductor is compared with another temporally shifted amplitude A1, A2, A3, AMP, AMP1 and AMP2 of another conductor in order to determine if the object or the sensor inside the object is closer to the first conductor or closer to the second conductor.

12. The method of claim 6 comprising determining a presence of an external alternating field when the absolute value of the difference is above a defined value.

13. A method for analyzing magnetic fields or signals used for determining a position of an object, the method comprising:

generating, by two or more conductors, two or more temporal shifted magnetic fields or signals, the two or more conductors arranged separately from each other;

capturing, by at least one sensor, the magnetic fields or signals generated consecutively by the two or more conductors;

determining the position of the object bearing the at least one sensor relative to the conductors from the fields or signals, wherein determining the position of the object comprises:

measuring a signal ($W_i$) or the magnetic field strength in periodic intervals;

determining a difference of the field strength of consecutive signal measurements ($W_i$-$W_{i+1}$);

performing N+1 measurements per direction in space, wherein N is an odd number; and calculating an amplitude A1 of the signal through the measurement values $W_i$ using the formula $$A1 = \frac{\sum_{i=1}^{N} \text{ABS}(W_i - W_{i+1})}{N};$$

calculating an amplitude A2 of the signal through the measurement values $W_i$ using the formula $$A2 = \text{MAX}(\{W_i\}) - \text{MIN}(\{W_i\}),$$

where $i \leq 1 \leq N$; and calculating an amplitude A3 of the signal through the measurement values $W_i$ using the formula, $$A3 = ABS(\text{MAX}\{W_i - W_{i+1}\}) + ABS(\text{MIN}\{W_i - W_{i+1}\}),$$

where $i \leq 1 \leq N$;

wherein a combination of the amplitudes A1, A2 and/or A3 are used as AMP in order to determine the position of the object relative to the conductors, wherein $$AMP = (\text{Factor1} * A1) + (\text{Factor2} * A2) + (\text{Factor3} * A3),$$

where Factor1, Factor2 and Factor3 normalize AMP;

wherein at least one of an amplitude AMP1 and AMP2 is used, in order to determine the position of the object wherein:

$$AMP1 = (Factor1 * A1) + (Factor3 * A3)$$

$$AMP2 = (Factor2 * A2) + (Factor3 * A3);$$

wherein one of the amplitudes A1, A2, A3, AMP, AMP1 and AMP2 of a first conductor is compared with another temporally shifted amplitude A1, A2, A3, AMP, AMP1 and AMP2 of another conductor in order to determine if the object or the sensor inside the object is closer to the first conductor or closer to the second conductor;

wherein generating, by two or more conductors, two or more temporal shifted magnetic fields or signals, the two or more conductors arranged separately from each other comprises completely or partially separating the two or more conductors from each other;

wherein capturing, by at least one sensor, the magnetic fields or signals generated consecutively by the two or more conductors comprises laying out two or more sensors orthogonally.

14. The method of claim 13, comprising determining a presence of an external alternating field when the absolute value of the difference is above a defined value.

* * * * *